US008087153B2

(12) United States Patent
Kato et al.

(10) Patent No.: US 8,087,153 B2
(45) Date of Patent: Jan. 3, 2012

(54) MANUFACTURING METHOD OF AN ELECTROMECHANICAL TRANSDUCER

(75) Inventors: Ayako Kato, Kawasaki (JP); Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 261 days.

(21) Appl. No.: 12/489,315

(22) Filed: Jun. 22, 2009

(65) Prior Publication Data

US 2009/0313809 A1 Dec. 24, 2009

(30) Foreign Application Priority Data

Jun. 24, 2008 (JP) ................................ 2008-165066

(51) Int. Cl.
*G01R 3/00* (2006.01)

(52) U.S. Cl. ............ 29/595; 29/594; 29/609.1; 29/836; 29/846; 310/330; 310/331; 310/332; 310/340; 333/186; 333/187; 333/188; 333/198

(58) Field of Classification Search ................ 29/592.1, 29/594, 595, 609.1, 836, 846; 73/12–504.16; 310/330–332, 340, 344, 345; 333/186–189
See application file for complete search history.

(56) References Cited

U.S. PATENT DOCUMENTS

2009/0313808 A1* 12/2009 Kato et al. ...................... 29/594
2009/0320274 A1* 12/2009 Kato et al. ...................... 29/596
2010/0207484 A1* 8/2010 Chang ........................... 310/300

FOREIGN PATENT DOCUMENTS

JP 2007-188967 A 7/2007

OTHER PUBLICATIONS

Xuefang Zhuang, Sensors and Actuators A 138 (2007) 221-229, "Integration of trench-isloated through-wafer interconnects 2-d capacitive micromachined ultrasonic transducer arrays".

* cited by examiner

*Primary Examiner* — Paul D Kim
(74) *Attorney, Agent, or Firm* — Canon U.S.A., Inc., IP Division

(57) ABSTRACT

A handling member is prepared that provides a channel that can withstand subsequent back face processing as to a substrate having elements made up of a substrate and a membrane, and the handling member is fixed to the substrate so that at least a portion within the elements are supported by the handling member. This provides a manufacturing method wherein the physical strength of an element at the time of manufacturing an electromechanical transducing apparatus is strengthened, and the handling member is easily detached in a short time after processing of the element.

7 Claims, 19 Drawing Sheets

MANUFACTURING METHOD OF AN ELECTROMECHANICAL TRANSDUCER

BACKGROUND OF THE INVENTION

1. Field of the Invention

The present invention relates to an electromechanical transducer and a fabrication method of an electromechanical transducing apparatus.

2. Description of the Related Art

Recently, research pertaining to electromechanical transducers using micromachining has been widely conducted. Particularly, a capacity-type of electromechanical transducer is a device to transmit or receive elastic waves such as ultrasonic waves using a lightweight vibrating film, and a wide bandwidth is readily obtained whether in liquid or in air, thereby has received focus as a technique more desirable for high-precision ultrasound wave diagnosis than current medical diagnostic modality.

Such a capacity-type electromechanical transducer is made up of elements wherein multiple cells having a space (hereafter called cavity) between a substrate and a thin film which is a vibrating membrane are formed and electrically connected. An electromechanical transducing apparatus is created by electrically bonding an integrated circuit to a substrate serving as the electromechanical transducer. However, since the substrate itself is thin, there has been the problem of easily breaking during handling or processing at the time of fabrication. Also, the substrate detects a signal for each element, and therefore may perform trench formation to form a recessed portion by removing a portion of the back face of the face whereupon the vibrating membrane is formed by shaving, polishing, etching, and so forth. By performing such trench formation, lower electrodes can be separated by element, and a signal can be detected for each element. However, the substrate has a thin substrate itself, which the trench formation causes to be thinner still, whereby performing further back-face processing with the substrate alone becomes difficult.

Now, Sensors and Actuators A 138 (2007) 221-229 described a technique wherein, in order to protect the vibrating membrane and to strengthen the substrate itself, a quartz substrate is used as a handling member, which is fixed to a face on the vibrating membrane side of the substrate, via a dry film. Subsequently, trench formation and fabrication of a lower electrode is performed on the back face of the fixed face, and flip chip bonding is used to bond with the integrated circuit. Lastly, the quartz substrate using for handling is removed and the cell surface is exposed to fabricate the electromechanical transducing apparatus.

Also, Japanese Patent Laid-Open No. 2007-188967 discloses a substrate processing method which, although differing from the electromechanical transducer, provides a channel to the handling member and supports the substrate, and performs back-face processing and the like of the substrate. By forming a metallic layer on the channel of the handling member, in the event that the handling member is removed, an acid or alkali dissolving solution to dissolve metal is supplied to the channel, whereby the handling member is separated from the substrate.

SUMMARY OF THE INVENTION

In Sensors and Actuator A 138 (2007) 221-229, a flat quartz substrate is employed as a handling member, and is fixed to a substrate via a dry film (adhesive agent). Therefore, in order to remove the handling member, when placing acetone on the adhesive face to separate, there may be cases wherein the acetone cannot permeate to the center portion of the adhesive face and cannot remove the handling member. In the case of removing the handling member by mechanical polishing, precise control is required, and this also takes time.

Also, in Japanese Patent Laid-Open No. 2007-188967, a channel is provided to the handling member, but the shape of the channel and the method of fixing the handling member in relation to the elements and the trench formation portion are not taken into consideration. Therefore, even if the handling member herein is fixed to the substrate that serves as the electromechanical transducer, there is the possibility that the substrate will break.

Thus, with the present invention, the probability of the substrate breaking at the time of handling or processing can be decreased by considering the positions of the trenches to be formed on the substrate, and by fixing the handling member having channels.

In order to solve the above-mentioned problems, a manufacturing method of an electromechanical transducer is provided with the following features. That is to say, a manufacturing method of an electromechanical transducer, wherein the electromechanical transducer has an element including: a substrate; and a vibrating membrane provided so that a space is formed between the substrate and the vibrating membrane; the manufacturing method including a fixing procedure to fix a handling member, wherein a groove is formed, to a face on a vibrating membrane side of the element; a procedure to form a trench on a face on an opposite side from the face of the side wherein the vibrating membrane is formed on the element; and a removal procedure to remove the handling member from the element, wherein in the fixing procedure, the groove of the handling member configures a portion of a channel to externally communicate in a state of the groove being fixed to the element, and wherein the handling member is fixed to the substrate so that at least a portion within the element is supported by the handling member.

According to the present invention, the probability of the substrate breaking at the time of handling or processing can be decreased, whereby manufacturing yield of the electromechanical transducers can be improved.

Further features of the present invention will become apparent from the following description of exemplary embodiments with reference to the attached drawings.

DESCRIPTION OF THE EMBODIMENTS

Embodiments of the present invention will be described in detail below with reference to the appended drawings. An electromechanical transducer according to the present invention is not limited to the capacity-type electromechanical transducer; rather, any type may be used as long as of a similar configuration. For example, an electromechanical transducer using a detecting method with distortion, magnetic field, or light may be used.

Figure 2A:
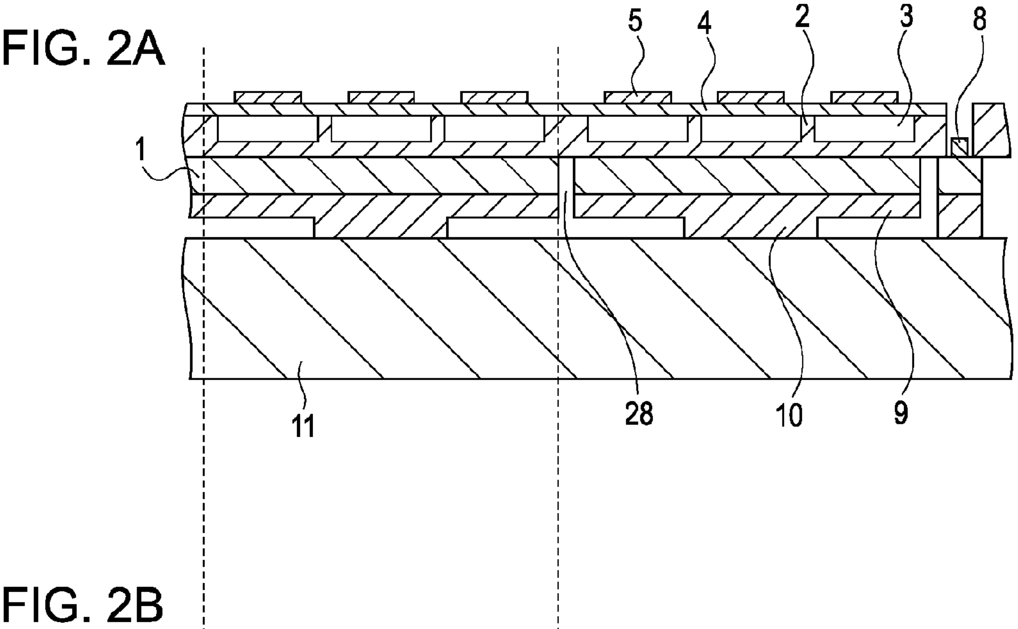
FIGS. 2A and 2B are schematic diagrams of a basic configuration of an electromechanical transducing apparatus.
Figure 2B:
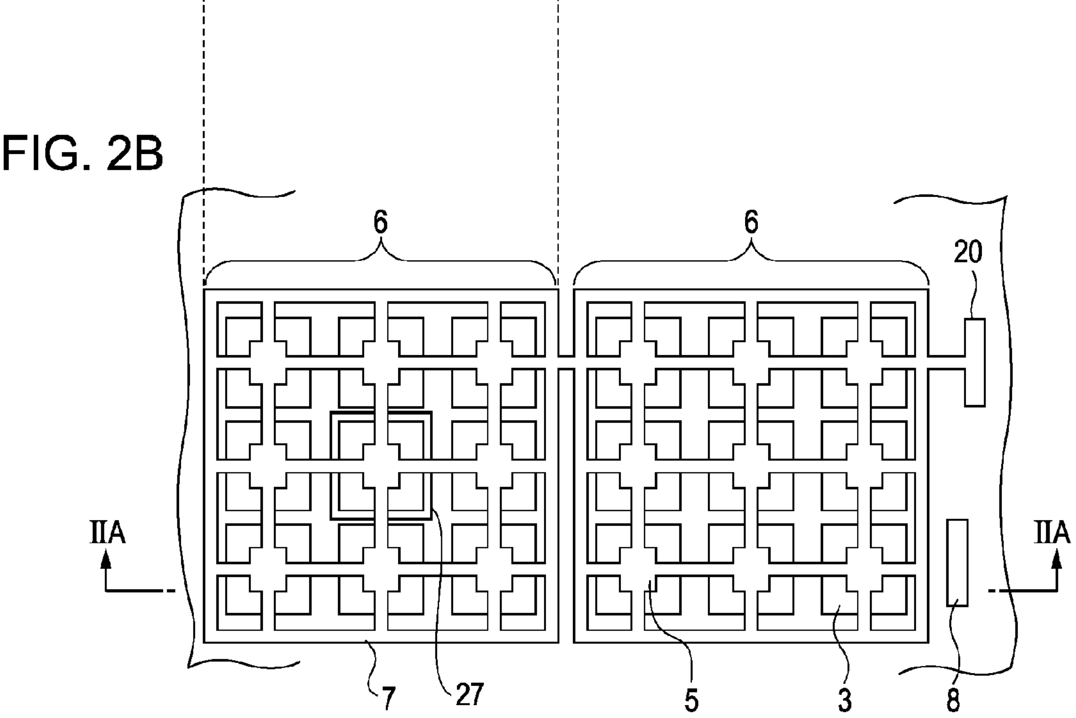

FIGS. 2A and 2B are an example of a configuration of an electromechanical transducing apparatus. FIG. 2A is a cross-sectional schematic diagram, and FIG. 2B is an upper face schematic diagram. The cross-section at the IIA-IIA line in FIG. 2B is FIG. 2A. FIG. 2A shows a membrane 4 which is a vibrating membrane on top of a substrate 1, and a membrane supporting portion 2 to support the membrane 4 (i.e. a vibrating membrane supporting portion). Also, a cavity 3 which is a space between the membrane 4 and the membrane supporting portion 2 is formed, and an upper electrode 5 is formed on the membrane 4. The cavity only needs to be formed between the substrate and the membrane, and an insulating film may be formed so as to become a portion of the membrane supporting portion 2 on the substrate. In the case also that the substrate and membrane supporting portion are integrated (in the case of forming a portion of a cavity by forming a recessed portion on the substrate), the portion supporting the membrane becomes the membrane supporting portion. In the case of FIGS. 2A and 2B, an element is made up of the substrate 1, membrane supporting portion 2, membrane 4, nine cavities 3, an upper electrode 5, and a lower electrode 9. The upper electrode 5 may be provided to at least one location of the upper portion, back face, and inner portion of the membrane 4, or the membrane 4 itself may be used as the upper electrode. Also, the configuration of an element as to one cavity is expressed as a cell. That is to say, an aggregate wherein at least one or more cells have collected and electrically bonded is an element 6. In the case of FIGS. 2A and 2B, there are two elements 6. The region of the element 6 is a region surrounded by the solid line in FIG. 2B, and of the cells making up the element 6, is the region surrounded by the outermost wall of each cell making up the outermost circumference. The reference numeral 7 denotes one side of the sides of the element that has four sides. Also, all of the potential of the upper electrode 5 is shared across all elements, and are joined to an upper electrode pad 20. The lower electrodes which are made up of the substrate 1 and lower electrode 9 are separated by the trench 28 separating each element 6. The mechanical vibration received by each cell of each element 6 is converted to an electric signal for each element, and is transmitted from the lower electrode, which is made up of the substrates 1 separated by the trenches 28 and the lower electrode layer 9 for taking out the signal, to the integrated circuit 11, via a bump 10 which is an electrical contact point. The upper electrode 5 is provided in an array for each element. With the present invention, the electromechanical transducer and the integrated circuit make up the electromechanical transducing apparatus.

The fabrication method of a substrate having such elements is not particularly limited, but may be fabricated for example using a method as shown in FIGS. 3A through 3H. In FIGS. 3A through 3H a one-cell-one-element fabrication method is shown as an example.

Figure 3A:
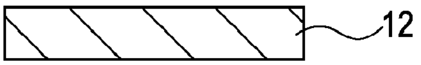
FIGS. 3A through 3H are fabrication flow schematic diagrams of a substrate.
Figure 3B:
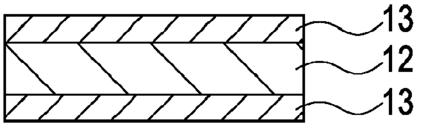
Figure 3C:
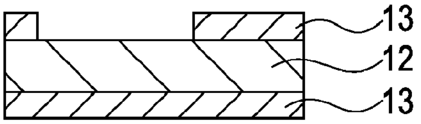
Figure 3D:
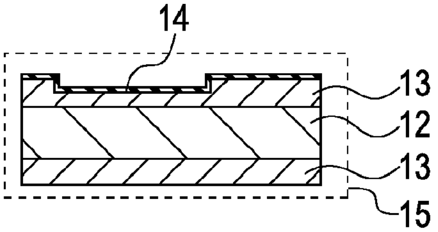

As shown in FIG. 3A, a cleaned silicon substrate 12 is prepared. Next, as shown in FIG. 3B, the silicon substrate 12 is placed in a thermal oxidation furnace to form a thermally oxidized film 13. The thermally oxidized film 13 becomes the portion wherein a cavity is formed (membrane supporting portion), whereby the thickness of the thermally oxidized film 13 is desirable to be in the range of 10 nm through 4000 nm, the range of 20 nm through 3000 nm is more desirable, and the range of 30 nm through 2000 nm is most desirable. Next as shown in FIG. 3C, the thermally oxidized film 13 is subjected to patterning. Next as shown in FIG. 3D, a second thermal oxidation procedure is performed, whereby an insulating film 14 is formed as a thin oxidized film. In order to secure insulation, the thickness of the insulating film 14 is desirable to be in the range of 1 nm through 500 nm, the range of 5 nm through 300 nm is more desirable, and the range of 10 nm through 200 nm is most desirable. In order to simplify the description of the procedures hereafter, the substrate having completed the processes through FIG. 3D will be called an A substrate 15.

Next, a SOI (Silicon On Insulator) substrate 26 is cleaned and prepared. The SOI substrate 26 is a substrate with a configuration in which an oxidized film (hereafter called BOX (Buried Oxide) layer 17) has been introduced between the silicon substrate (hereafter called handling layer 18) and surface silicon layer (hereafter called device layer 16). The device layer 16 of the SOI substrate is a portion serving as the membrane. As an electromechanical transducer performing transmitting/receiving of ultrasound waves, a frequency bandwidth of 1 MHz through 20 MHz is desirable, and as a thickness of a membrane that can obtain such frequency bandwidth is obtained from relations such as a Young's modulus, density, or the like. Therefore, as a thickness of the device layer 16, 10 nm through 5000 is desirable, 20 nm through 3000 nm is more desirable, and the range of 30 nm through 1000 nm is most desirable.

Figure 3E:
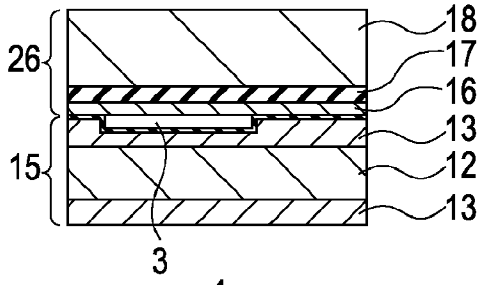

The SOI substrate herein is positioned together and bonded on top of the A substrate 15 so that the thermally oxidized film 13 and the device layer 16 are mutually in contact (to be on the inner side), as shown in FIG. 3E, whereby the cavity 3 is formed of the device layer 16 and the thermally oxidized film 13. Pressure conditions for the bonding procedure include ambient atmosphere, however, bonding in a vacuum atmosphere is preferable, since displacement of the membrane is limited while driving when air exists in the cavity, due to the cushioning effects of the air. By bonding in a vacuum, the membrane bends in the initial state, whereby only a small bias voltage is necessary at the time of driving. In the case of bonding in a vacuum, $10^4$ Pa or lower is desirable, $10^2$ Pa or lower is more desirable, and 1 Pa or lower is most desirable.

Note that the device layer 16 and thermally oxidized film 13 of the SOI substrate are dehydrated and condensed by heat processing and bonded. Therefore, the temperature of the bonding procedure is a temperature higher than room temperature, but if too high, the composition of the substrate may change, so a range of 1200° C. or less is desirable, 80° C. to 1000° C. is more desirable, and 150° C. to 800° C. is most desirable.

Figure 3F:
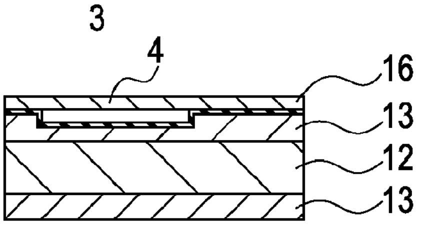

Subsequently, a LPCVD SiN film is formed over the entire surface of the substrate to be bonded, and only the LPCVD SiN film on the surface of the handling layer 18 on the SOI substrate side is removed by a method such as dry etching. Next, the handling layer 18 is subjected to wet etching by a heated alkali fluid. The alkali etching fluid has an extremely high Si-to-$SiO_2$ etching selection ratio (in the range of roughly 100 to 10,000), whereby the wet etching selectively etches to remove the handling layer 18, and stops at the BOX layer 17. Subsequently, using a fluid including hydrofluoric acid is used to etch and remove the BOX layer 17, whereby the state shown in FIG. 3F is formed. Wet etching is desirable as a removal method of the handling layer and BOX layer, but machine polishing or dry etching methods may also be used.

Note that in the case of bonding at a pressure lower than that of the atmospheric pressure, the device layer 16 of the substrate is deformed so as to bend in the substrate side by the atmospheric pressure, becoming in a recessed state. That is to say, the device layer 16 remains in a recessed state while in a state of not applying any particular external force, and becomes the membrane 4 of the electromechanical transducer.

Figure 3G:
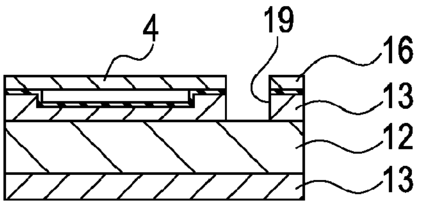

Next, the device layer 16 making up the membrane 4 is subjected to patterning by dry etching at a position where no cavity exists. The oxidizing film 13 is directly subjected to patterning by wet etching without removing the photoresist for patterning. With this procedure, an etching hole 19 is formed, as shown in FIG. 3G. The hole is preferably formed by wet etching as described above, but methods such as machine polishing or dry etching may be used.

Figure 3H:
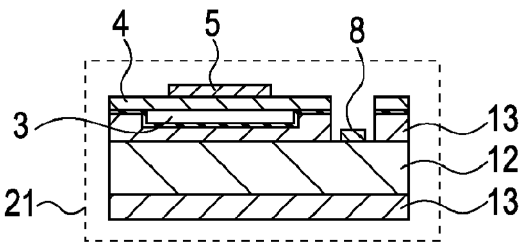

Next, a metallic film for use as an electrode is formed and subjected to patterning, and an unshown upper electrode pad and the upper electrode 5 and lower electrode pad 8 shown in FIG. 3H are formed. The substrate 21 can be thus fabricated. Note that the locations of the upper electrode pad and lower electrode pad may be provided at desired locations. Also, metals such as Al, Cr, Ti, Au, Pt, Cu and the like can be used for the metallic film.

In the case of an electromechanical transducer used for transmitting/receiving ultrasound waves, the bending of the membrane 4 is several hundred nm or less, while the cell dimensions (e.g. the diameter of the membrane 4) is several tens to several hundred μm. Therefore, with exposure processing in the patterning procedure for the metallic film, the membrane bending is smaller than the depth of focus of a normal exposure apparatus, whereby the metallic film can be provided without any exposure shift occurring such as light diffraction.

As shown in FIG. 3H, the silicon substrate 12 can be employed as the lower electrode. In the case that the silicon substrate 12 is not the lower electrode, a lower electrode having high conductivity can be embedded between the substrate 1 in FIG. 2A and the cavity base face. Also, in the case that the membrane is of an insulating material or in the case that an insulating film is formed on the cavity base face, a lower electrode can be provided on the cavity base face.

Another layer of insulating film, e.g. an insulating film made up of at least one dielectric material such as SiN, $SiO_2$, SiNO, $Y_2O_3$, HfO, HfAlO and the like, can be provided to the membrane 4, and the upper electrode can be disposed further on top of the insulating film herein. Also, with the present embodiment, the membrane 4 uses silicon, but the membrane 4 may be an insulating material, in which case the insulating film 6 with a high-permittivity material such as a SiN film does not have to be disposed. In this case, providing the upper electrode on top of the membrane 4 is desirable.

Further, with the present embodiment, the substrate is fabricated with the above-described procedure, but the substrate can also be fabricated by employing a MEMS technique such as surface micromachining (a method to form a cavity by removing a sacrificial layer such as the metallic layer).

Note that the cross-sectional diagram shown in FIG. 3H is an example of the electromechanical transducer, but in order to simplify the diagram, protective film for electric wiring or electric wiring between the upper electrode 5 and the upper electrode pad 20 and so forth are not shown in the diagram.

FIGS. 1A through 1G show an example of a method to fix a handling member, wherein a channel is provided, to the substrate and manufacture an electromechanical transducing apparatus. In order to simplify in FIGS. 1A through 1G, a portion of the electromechanical transducer is enlarged and shown as a schematic diagram.

Figure 1A:
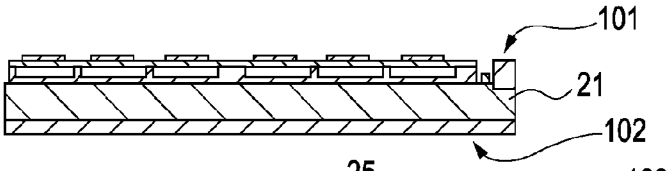
FIGS. 1A through 1G are manufacturing flow schematic diagrams of an electromechanical transducing apparatus.

As shown in FIG. 1A, a substrate 21 which is fabricated by the substrate fabrication procedure in FIGS. 3A through 3H is prepared. Now, of the faces having a substrate (i.e. the faces having elements), using the cavity as a base, let us say that the face on the membrane side is a "first face" and the face on the opposite side of the first face is a "second face". In the diagram, reference numeral 101 denotes the first face and 102 denotes the second face.

Figure 1B:
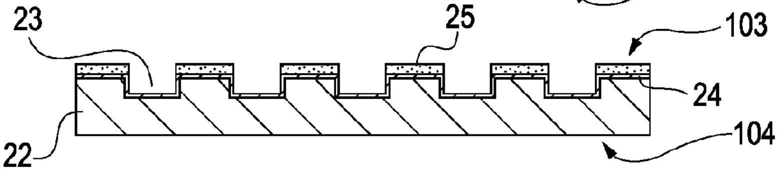

On the other hand, a handling member 22 is prepared by the handling member fabrication procedure as shown in FIG. 1B. The handling member 22 in FIG. 1B has provided a channel 23, metallic layer 24, and adhesive layer 25. Now, of the faces having a handling member, let us say that the face on the side fixed to the substrate is a "third face" and the face on the opposite side of the third face is a "fourth face". Also, the handling member has a groove formed on the third face so as to be a channel in the state of being fixed to the substrate. In the diagram, the reference numeral 103 denotes the third face and 104 denotes the fourth face. With the description hereafter, in the case of expressing the recessions/protrusions of the third face, the portion equivalent to the channel is called a "channel recessed portion" and the portion existing between a channel recessed portion and a recessed portion is called a "channel protruding portion". However, in the case that the term "channel" is used alone, this indicates a groove, as in the normal sense of the word, or a supply path for fluid that is provided by forming a groove. Also, in the case that a through hole is provided from the third face to the fourth face, the portion of the hold is equivalent to the channel recessed portion, and the third face other than the hole is equivalent to the channel protruding portion. A face other than the third face (e.g., the fourth face, or another face) communicates with at least one external location by way of these channels.

Figure 1C:
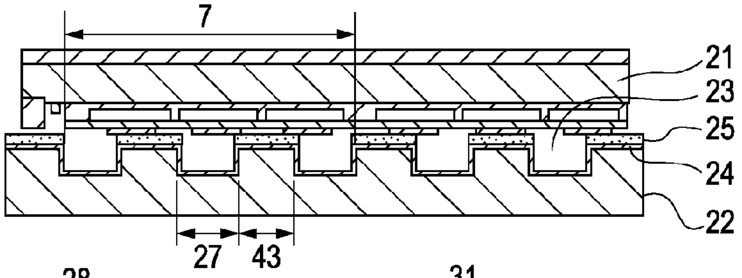

Reference numeral 27 in FIG. 1C denotes the width of the channel recessed portion, and reference numeral 43 denotes the width of the channel protruding portion. FIG. 1C illustrates a fixing procedure to fix the handling member 22 to the substrate 21 to be treated. With the fixing procedure herein, if the direction to fix the handling process is not considered in relation to the elements formed on the substrate, the membrane can break depending on the size, shape, and position of the groove. Although described in detail later, with the present invention, in order to decrease breakage of the substrate, the handling member is fixed to the substrate so that at least a portion within the elements is supported by the handling member.

Figure 1D:
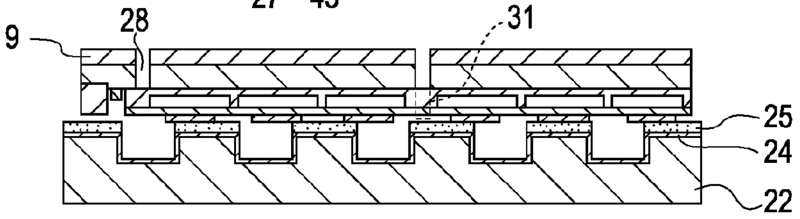
Figure 1E:
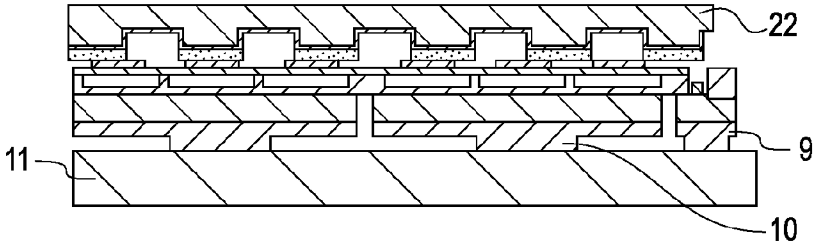

FIGS. 1D and 1E illustrate procedures to process the second face (hereafter called a back face processing procedure). In FIG. 1D, the silicon substrate 12 is cut down to a desired thickness, and a lower electrode layer 9 for the purpose of removing a signal is formed on the surface of the second face after cutting. Subsequently, trench formation is performed to form a trench 28 to separate the lower electrodes for each element 6. FIG. 1E shows a process to perform flip chip bonding (one process within the back face processing procedures). A bump 10 is formed on the integrated circuit 11, and an electromechanical transducer which is a substrate that has already been subjected to the trench formation is bonded thereto.

Figure 1F:
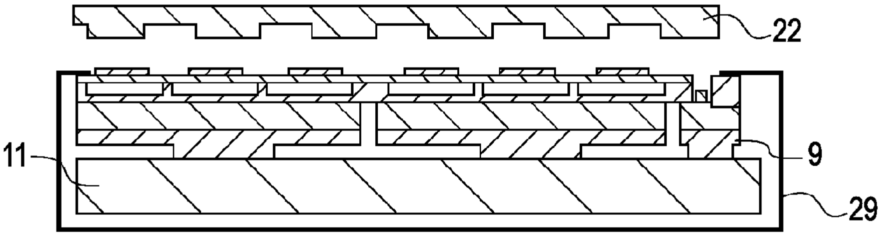

FIG. 1F shows a removal procedure to remove the handling member from the substrate after the flip chip bonding. Here, since a metallic layer 24 is formed, the handling member 22 can be removed by an acid or alkali dissolving solution that will dissolve the metallic layer 24 being supplied to the inner portion of the channel 23. As a method for supplying the dissolving solution to the channel, the dissolving solution may be supplied just to the channel 23, or the portion from the upper electrode 5 to the integrated circuit 11 may be protected with a protective case 29, and immersed in the dissolving solution with the handling member 22 fixed thereto. The contact portions between the protective case 29 and the side of the substrate that has already been subjected to back side processing differs in reality from FIG. 1F, and contact is made at a location sufficiently distanced from the element.

Figure 1G:
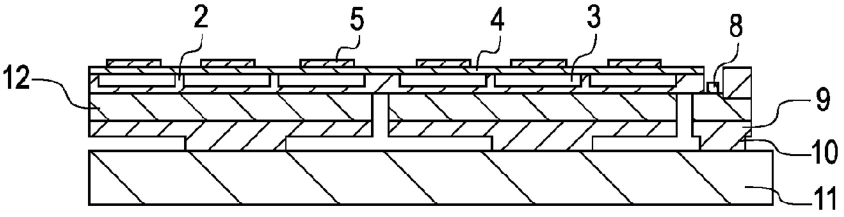

With the above-described procedure, an electromechanical transducing apparatus such as shown in FIG. 1G is completed.

Figure 4A:
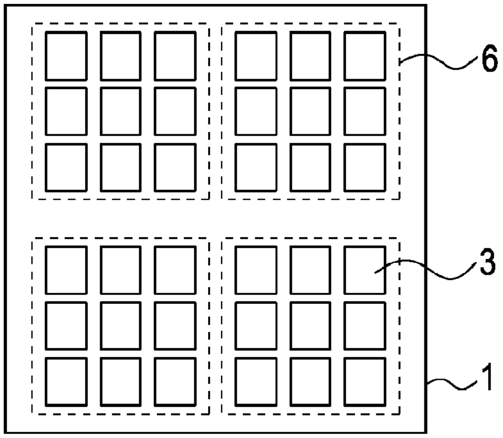
FIGS. 4A through 4C illustrate an example of a cavity shape (upper face diagram).
Figure 4B:
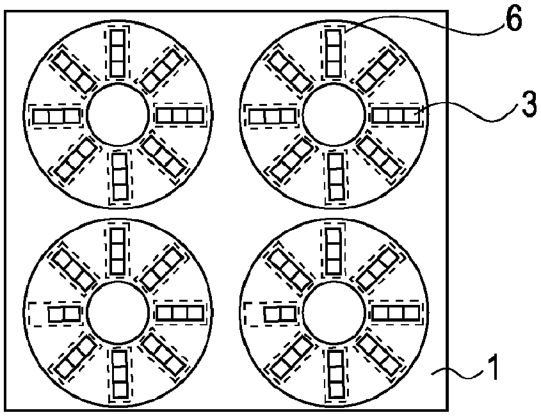
Figure 4C:
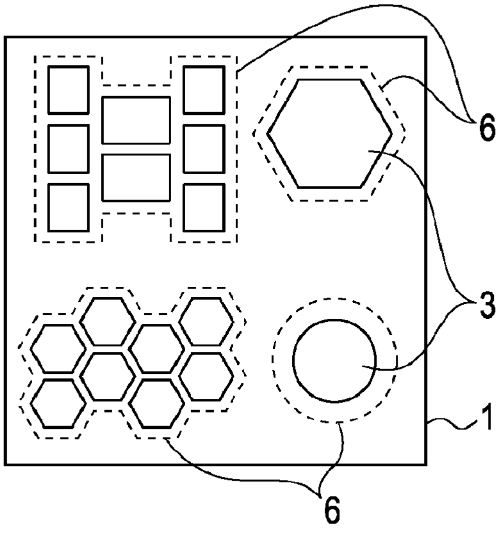
Figure 5:
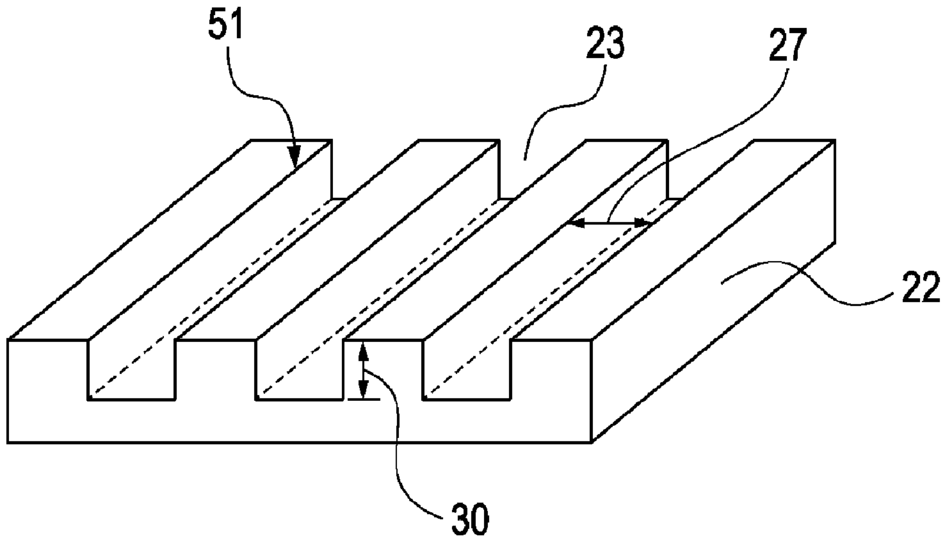
FIG. 5 is an example of a handling member provided with a channel (rectilinear).
Figure 6:
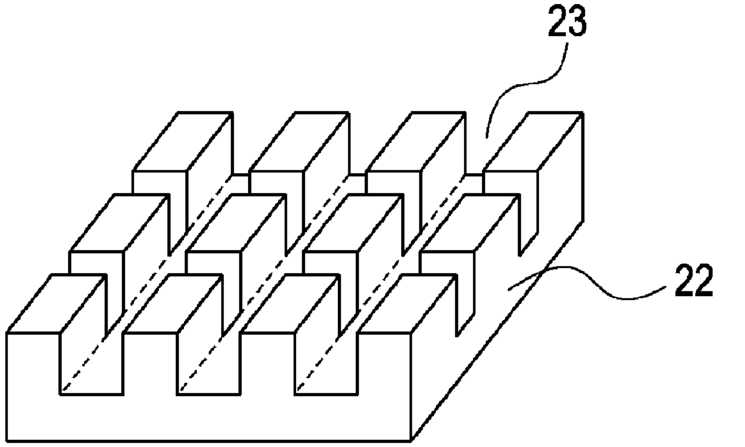
FIG. 6 is an example of a handling member provided with a channel (grid).

Next, the cavities and elements of an electromechanical transducer to which the present invention can be applied is described in detail with reference to FIGS. 4A through 4C. FIGS. 4A through 4C are schematic diagrams (upper face diagrams) showing an example of the shape of the first face of the cavity of the electromechanical transducer. In FIGS. 4A through 4C, the membrane, upper electrodes, and so forth are omitted.

In FIG. 4A, cells having a quadrangle cavity are disposed in a three rows by three columns array. These nine cells make up one element 6. One electromechanical transducer is made up by disposing two rows and two columns of the element 6. The cavities 3 and elements 6 can be formed so as to be disposed in a desired size and position. The form of the cavity 3 on the first face may be a quadrangle as shown in FIG. 4A, or may be a hexagon or a circle as shown in FIG. 4C, whereby a desired shape can be provided. Also, a desired number of cavities 3 (cells) making up the elements 6 may be provided. As shown in FIG. 4B, the size and position of the element 6 may also be provided as desired. Cavities having different forms and sizes may also be provided within the electromechanical transducer as shown in FIG. 4C. Also, the positioning of the cavities (cells) may be arranged in a matrix shape or in a staggered pattern, a ray pattern, a circle form or the like, and any sort of disposal form may be used with the substrates.

Next, details of the handling member provided with channels and a fixing method for the handling member will be described. With the present invention, in order to reduce breakage of the substrate, the handling member is fixed to the substrate so that at least a portion within the elements is supported by the handling member. By fixing thus, the burden placed on the element can be lessened. Also, the substrate is subject to trench forming in the back face processing procedure, the remaining trench formed portion has a thickness of 1 mm or less.

An integrated circuit is bonded to such a substrate having a weak mechanical strength, with flip chip bonding. Therefore, reducing the burden placed on the thin trench formed portion is required. That is to say, it is desirable for the handling member to uniformly support the trench formed portions. Accordingly, it is desirable for the handling member to be fixed to the substrate such that the length of the portion of the trench formed portion not supported by the handling member is less than the length of the longest side of the element. In other words, the handling member is fixed to the substrate so that the length of the trench formed portion corresponding to the channel recessed portion is shorter than the length of the longest side of the element. The “trench formed portion” here refers to 31 in FIG. 1D, and depending on the trench shape, indicates the remaining portion of the substrate that exists in the position when the lower electrode (substrate and lower electrode layer) is removed by the trench being formed. That is to say, this indicates the membrane supporting portion of the portion wherein no lower electrode exists and the membrane. Also, “the length of the portion of the trench formed portion not supported by the handling member” refers to the continuous length of the trench formed portion existing as an overlap with the channel recessed portion in the event of considering a projection view seen from the first face in the state that the handling member is fixed to the substrate.

Figure 23A:
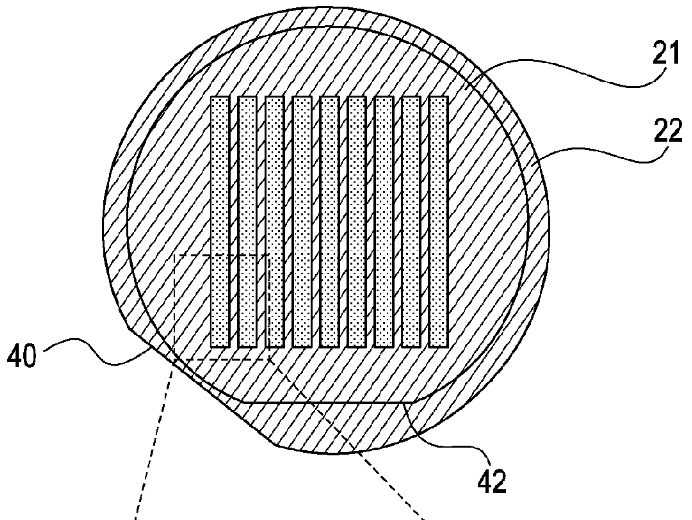
FIGS. 23A and 23B are a second projection view of the handling member and the substrate.
Figure 23B:
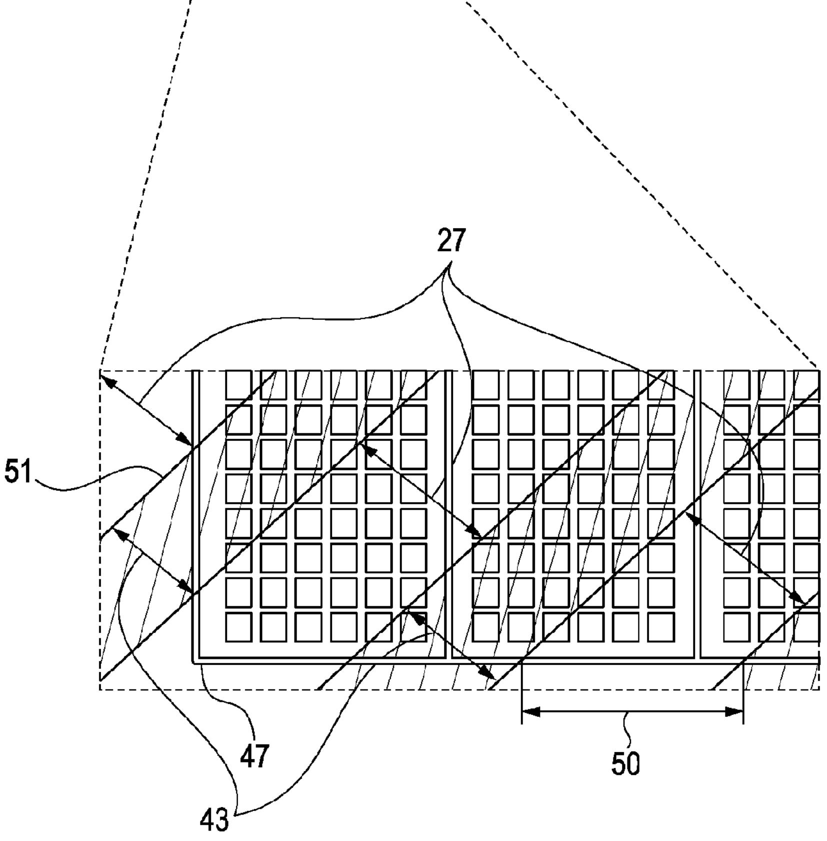

Specifically, this is the portion shown by reference numeral 50 in FIGS. 23A and 23B. That is to say, 50 becomes shorter than the length of the side which is the longest of the sides of the element. Specifically, in FIG. 23A, the handling member having linearly shaped channels is fixed at an angle of 45 degrees as to the long side of the rectangular shaped element of the substrate. FIG. 23B is a schematic diagram having enlarged a portion of FIG. 23A. We can see that the length 50 of the trench formed portion that exists overlapping with the channel recessed portion 27 is shorter than the longest side of the element. With such a configuration, the length of the trench formed portion that is not supported by the channel protruding portion does not become too long, whereby the probability that the substrate will break from the thinned trench formed portion can be reduced.

It is more desirable for the length of the trench formed portion not supported by the handling member to be shorter than the length of the shortest side of the element. The trench formed portion can be more densely supported if the length of the trench formed portion not supported by the channel protruding portion is shorter than the shortest side of the element.

Figure 22A:
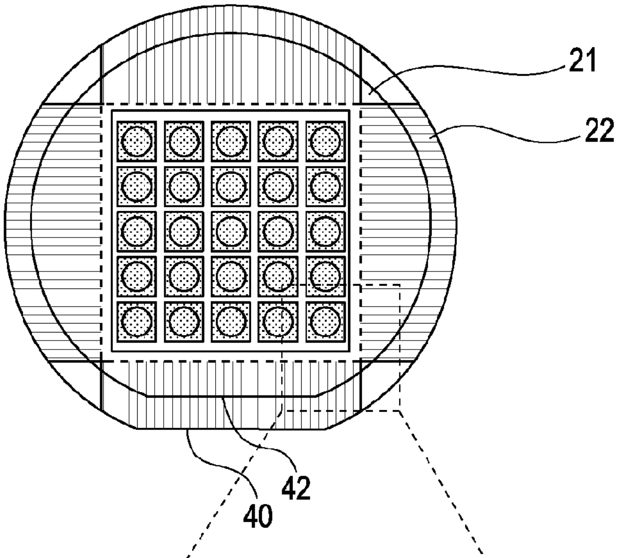
FIGS. 22A and 22B are a first projection view of the handling member and the substrate.
Figure 22B:
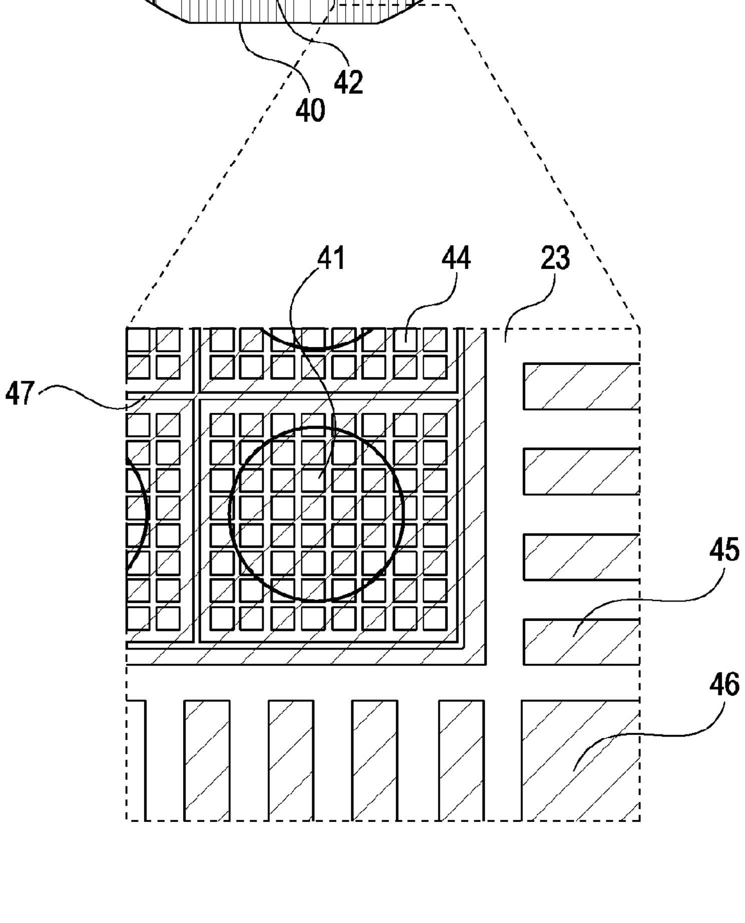

Further, if the entire trench formed portion is arranged so as to be supported by the handling member, all regions of the trench formed portions can be supported, so this is a desirable arrangement. Specifically, FIGS. 22A and 22B are schematic diagrams showing that the channel protruding portion of the handling member having linear-shaped or hole-shaped channels is fixed so as to face all of the trench forming portions. With the present invention, channels are made only from holes, and even in the case that a hole and another hole are not connected, the spread of holes over the third face is considered to be a channel. FIG. 22B is a schematic diagram showing an enlarged portion of FIG. 22A. 25 square elements are formed within the substrate in FIG. 22A. A handling member having a linear channel and through hole 41 is fixed on top of such substrate. In FIG. 22B, the shaded portions show the locations of the channel protruding portions fixed to the substrate, and the projected view shows that all of the trench formed portions overlap with the regions of the channel protruding portions.

Also, it is desirable for the edges of the groove to intersect with sides of at least two or more elements, for each element. The edge of the groove refers to an angular portion of the channel protruding portion, and is a line showing the boundary between the channel protruding portion and the channel recessed portion on the third face. Also, "the edges of the groove to intersect with at least two or more element sides, for each element" indicates that the edge of one continuous groove in one element unit intersects with sides of two or more elements. This is shown by reference numeral 51 in FIGS. 23A and 23B. Specifically, in FIG. 23B, the edge of the continuous groove (channel protruding portion) as to one element intersects to sides of two or more elements. By providing the channel protruding portions across adjacent elements, the element portion can be more strongly supported.

Also, in order to improve mechanical strength of the substrate, it is desirable for the channel protruding portion to be configured to bond in many places as to the element. Particularly, mechanical strength improves when the elements are all supported by the handling member.

The size of the channel only has to be a size so that the dissolving solution can permeate through the channel, but it is desirable for the size thereof to accommodate the size of the elements. Specifically, the width 27 of the channel recessed portion to be 2000 μm or less is desirable. Further, the pitch of the channels (the width of one channel protruding portion adjacent to one channel recessed portion) to be smaller the longest side of the element on the substrate is desirable. By using such a handling member, the strength of the substrate can be supplemented in a well-balanced manner, further reducing breakage. Also, the groove serving as the channel is formed by a dicing process or laser process, whereby the depth of the channel (i.e. the depth of the groove) is desirable to be 10 μm or greater. Now, the width of the channel recessed portion and channel protruding portion refers to the width of the channel recessed portion and channel protruding portion on the third face, and the channel depth refers to the depth of the formed channel down to the deepest portion thereof.

Figure 7:
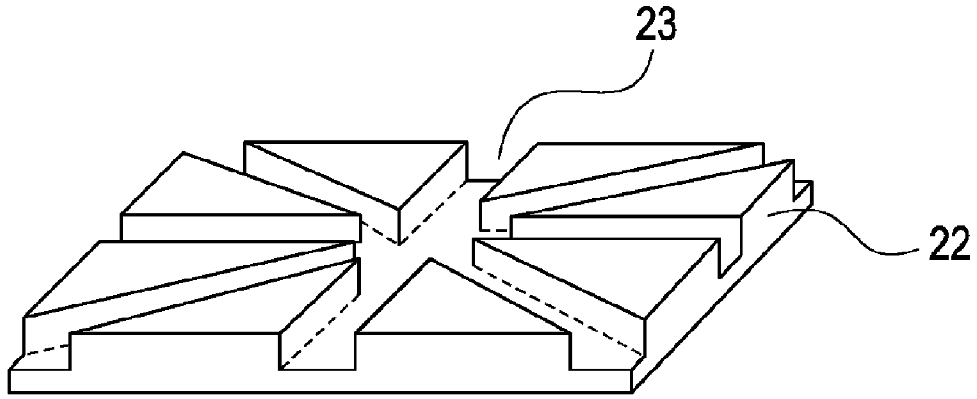
FIG. 7 is an example of a handling member provided with a channel (ray).
Figure 8:
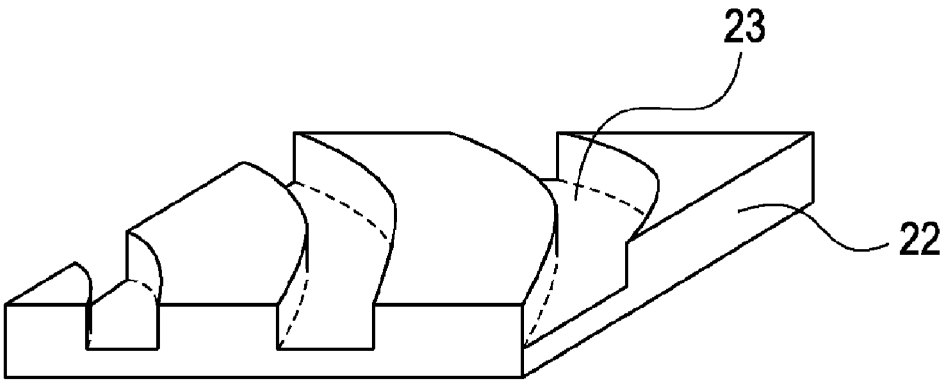
FIG. 8 is an example of a handling member provided with a channel (curved lines).

A specific channel shape will be described with reference to FIGS. 5 through 8. Reference numeral 51 in the diagram shows the edge of the channel. In a case of a circumferential channel as in FIGS. 5 and 6, the entire substrate is easily maintained evenly and is therefore desirable. Also in the case of such a channel shape, there is an advantage wherein permeation of the dissolving solution by capillary action more readily occurs in the subsequent removal process of the handling member. Further, in the case of using a handling member providing hole at a base point (center point) of the channels in a ray shape such as shown in FIG. 7, the dissolving solution is supplied from the hole, and the handling member and substrate are rotated with the base point as an axis. Thus supplying of the dissolving solution can be made effective by centrifugal force and can quickly detach the handling member, and is therefore desirable. In the case of using a curved channel shape such as shown in FIG. 8, in the case the positioning of the elements within the substrate is in a curved shape, the entire substrate can be uniformly maintained and therefore is desirable. Also in the case of a curved shape, the area of an element that one channel protruding portion makes contact with can be increased more than that of a linear shape, and therefore is desirable. Further in the case that the channel is in a whirlpool shape having a hole at the start of the whirlpool, the dissolving solution can be supplied from the starting point of the whirlpool and the dissolving solution can be collected from the end point, whereby the dissolving solution used is not wasted and is therefore desirable. By combining various shapes and holes, the dissolving solution can more readily permeate during the procedure to removing the handling member. Also, the replacement of the dissolving solution can be advanced, whereby the removing of the substrate and handling member can be quickly performed and is therefore desirable.

Figure 9:
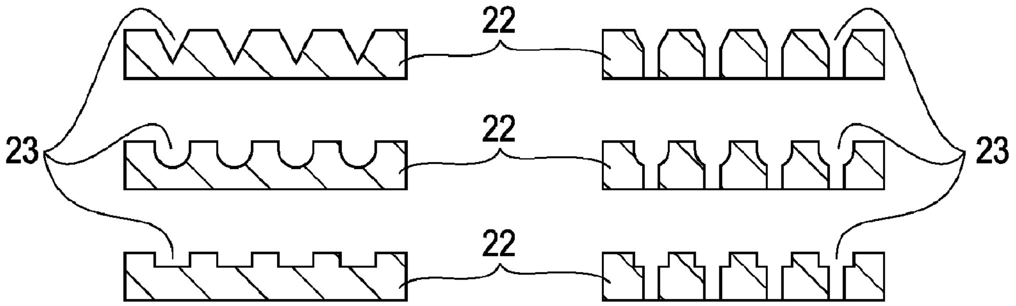
FIG. 9 is an example of a handling member provided with a channel (cross-sectional diagram).

FIG. 9 shows an example of a cross-sectional diagram of a handling member providing a channel (cross-sectional diagram in the direction perpendicular as to the third face). Multiple shapes of channels may also be combined, such as providing holes in the channels. Also, regarding the cross-sectional shape in the direction perpendicular to the third face may be various shapes such as a half-moon, quadrangle, or triangle. The shape herein may be selected as appropriate, according to the features of the substrate used and the method of providing the channel.

The base material for the handling member 22 may be a material such as the following. Various types of glass substrates such as synthetic quartz or Pyrex (registered trademark), a semiconductor substrate such as a silicon wafer, or a plastic substrate or metallic substrate may be used, as long as the substrate has a certain amount of rigidity. Of these, considering the flatness of the substrate and ease of processing, a quartz substrate, silicon wafer, photosensitive glass substrate, or the like is desirable.

Regarding a method to provide the channel, the channel can be formed by etching employing a photolithography technique, a laser process, machining, sandblast, or the like. In the case of any protrusions or soiling on the channel surfaces after processing, performing polishing or cleaning is desirable.

Figure 10:
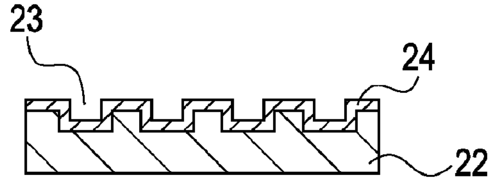
FIG. 10 is an example of a handling member provided with a metallic layer (cross-sectional diagram).

FIG. 10 is a diagram showing one metallic layer 24 provided on the channel recessed and protruding portions of the handling member having channels. On top of providing the metallic layer 24, an adhesive layer is provided and the metallic layer 24 fixed via the adhesive layer, whereby the handling member can be quickly removed from the substrate. The metallic layer 24 is not particularly restricted as long as the metallic layer can be dissolved with an acid or alkali dissolving solution, but aluminum, germanium, titanium, and indium can be used. Particularly aluminum and germanium can readily be deposited in a vacuum on the third face side with a method such as sputtering, and therefore are desirable. Also, a thin metallic layer is more readily removed, whereby the thickness of the metallic layer 24 is desirable to be 10 μm or less, and 5 μm or less is more desirable. Further, the range of 1 to 2 μm is most desirable. As shown in FIG. 10, the metallic layer 24 can be provided over the entire third face, or metallic layer 24 can be provided over a portion of the third face. Also multiple metallic layers 24 may be provided. However, in the case that the upper electrode is formed within the element, it is desirable that a metal with an etching rate higher than the metal used for the upper electrode is used.

Figure 11:
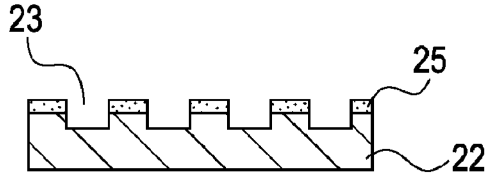
FIG. 11 is an example of a handling member provided with an adhesive layer (cross-sectional diagram).

FIG. 11 is a diagram showing a portion of the third face side (channel protruding portion) provided instead of providing the metallic layer 24. With the fixing method herein, the adhesive layer 25 only makes contact with a portion of the substrate, whereby the time it takes to remove the adhesive layer 25 can be shortened, and is therefore desirable. In this case, a dissolving solution such as an organic solvent that can dissolve the adhesive layer 25 should be used to remove the handling member. The adhesive layer 25 may be provided over the entire third face side as with the metallic layer 24 in FIG. 8, or may be provided on the first face in FIG. 1A.

The adhesive layer 25 is not limited as long as the substrate and the handling member are fixed, and the adhesive layer 25 has an adhesive force that can support the substrate at the time of later processing of the substrate. However, with the later back face processing procedure of the substrate, heating and pressurizing processing is performed, whereby a resist, polyimide, heat-resistant wax, heat-resistant double-sided tape, and so forth are desirable. So that such a double-sided tape makes contact only with the channel protruding portion, the tape can be applied traversing crossing over the channels. The adhesive layer 25 can be more readily removed if thin, whereby the thickness of the adhesive layer is desirable to be 30 μm or less, and is more desirable to be 20 μm or less. However, in order to by thin and yet secure the adhesive force, the range of 1 to 20 μm is most desirable.

Further, as shown in FIG. 1B, the metallic layer 24 may be provided on the third face side and the adhesive layer 25 provided on top thereof. The adhesive layer 25 may be provided over the entire channel, but in the case of providing a metallic later, providing only to the channel protruding portion is desirable since the metallic layer can be readily removed.

On the other hand, hydrophilic processing may be performed as to the surface of the channel of the handling member. Hydrophilic processing can be realized by performing UV cleansing, detergent cleansing, alcohol cleansing, plasma irradiation, HF processing, coating processing and so forth. By performing hydrophilic processing, the dissolving solution can be readily supplied to within the channels at the time of removing the handling member. The hydrophilic processing can be performed directly as to the surface of the channel, or in the case of providing a metallic layer on the surface of the channel, may be performed on the metallic layer.

Also, it is desirable for the size of the handling member such as that described above to be larger than the substrate. When the handling member is larger than the substrate, the probability is reduced that jigs or tools will come in contact with the substrate, at the time of handling and processing of the substrate. For example, in the case that the size of the substrate is 4 inches, it is desirable for the size of the handling member to be roughly a 4-inch+2 cm size. Also, the thickness thereof is not particularly restricted, but should be of a thickness that the handling member is not broken. Normally a thickness of 200 μm or greater is desirable, and a thickness in the range of 500 μm to 3000 μm is more desirable.

Figure 12:
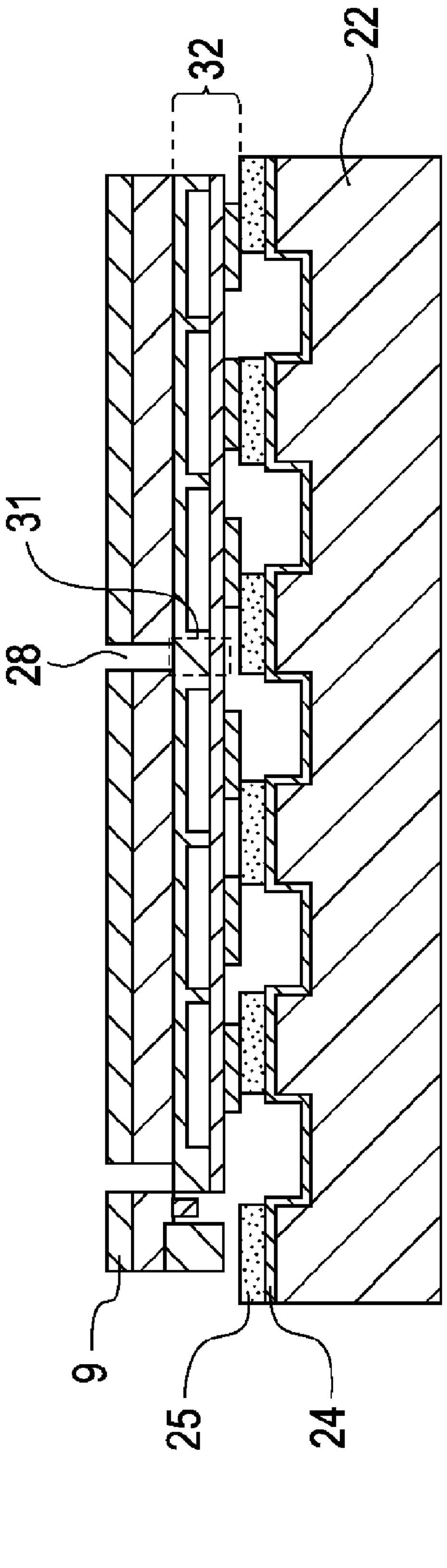
FIG. 12 is an example of a state after trench formation.

FIG. 12 is a schematic diagram of after processing the trench 28, and is the same diagram as that in FIG. 1D. At the time of trench 28 processing, first from the second face side, shaving and polishing is performed until the thickness of the silicon substrate 12 becomes a thickness of roughly 120 to 180 μm. Next, the trench 28 is provided so as to be separated at each element 6. The trench 28 can be fabricated by employing an etching technique, and performs processing up to a depth that arrives at the cavity base portion. When the spacing between the elements is great, the portion of the spacing (trench formed portion) cannot detect a signal, whereby a smaller trench width is desirable. Specifically, the width of the trench 28 is desirable to be 20 μm or less, and more desirable to be 5 μm or less. Further, 2 μm or less is most desirable. Finally, the lower electrode layer 9 for the purpose of taking out the signal is provided. The lower electrode layer 9 for the purpose of taking out the signal is formed by subjecting the protrusion portion already processed to evaporation coating in the order of titanium, copper, and silver, to respective thicknesses of roughly 200 A, 500 A, and 1000 nm. With such a process, the depth of the trench arrives at the insulating layer of the vibrating portion, whereby the thicknesses of the trench processing portion 31 and vibrating portion 32 are roughly the same, and are often 1 μm or less.

After the trench 28 processing in FIG. 12, the substrate 21 is flip-chip-bonded to the integrated circuit 11 as shown in FIG. 1E. The bump 10 is not particularly limited as long as the lower electrode can be strongly joined to the integrated circuit 11. Generally, various types of bumps of various types of metals such as Zinc, Gold, Silver, Copper, Tin, and Lead, or combinations thereof, are used. Also, even if flip-chip bonding is not used, any method to electrically connect the integrated circuit and substrate may be used.

Figure 13:
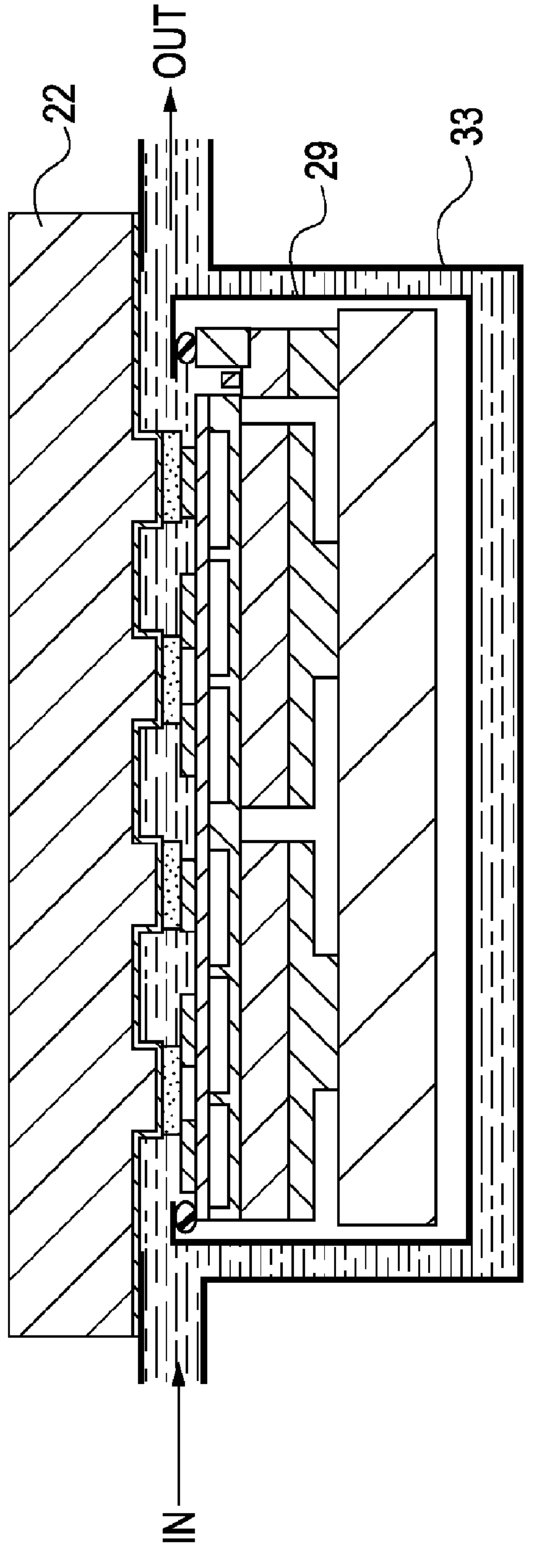
FIG. 13 is an example of a handling member removal procedure (protection of the integrated circuit side).

FIG. 13 is a schematic diagram in the event of removing the handling member 22 from the substrate 21. In order to remove the handling member 22, supplying a dissolving solution to the channel 23 of the handling member 22 and dissolving the metallic layer 24 and adhesive layer 25 is desirable, so as not to break the integrated circuit 11 or substrate 21. In FIG. 13, after the flip chip bonding, the portion on the lower side from the membrane 4 (the portion other than the handling member) is covered with a protective case 29, and set in a container 33 filled with dissolving solution so that the edge of the handling member 22 is outside of the container 33. Whether or not to use the protective case 29 only has to be determined according to the removal method or dissolving solution to be employed. Also, in the event of flip chip bonding, by employing an underfill (resin adhesive agent), the handling member 22 can be removed without using the protective case 29.

The dissolving solution is guided by capillary action or natural diffusion into the channel 23 of the handling member. In order to more quickly guide the dissolving solution into the channel, external stimulation may applied to the container 33. The container 33 may be subjected to temperature change, whereby convection occurs in the dissolving solution, or the dissolving solution may be agitated with a magnet stirrer or vibrating apparatus. Also, a vibration such as an ultrasound wave may be applied to the container 33. Further, providing an entry and exit to the container 33, whereby the dissolving solution may be exchanged, may be effective.

In order to remove the handling member more effectively, controlling the flow of dissolving solution within the channel 23 is desirable. By supplying the dissolving solution direction to the channel entry, the adhesive layer 25 and metallic layer 24 can be dissolved more quickly. However, the flow speed (flow pressure) is desirable to be such that the membrane 4 of the substrate 21 within the channel does not break. With a configuration such as shown in FIG. 13, as the dissolving of the metallic layer 24 and adhesive layer 25 advance a certain amount, the substrate 21 moves by its own weight to the base portion of the container 33. The handling member 22 can be thus removed.

Figure 14:
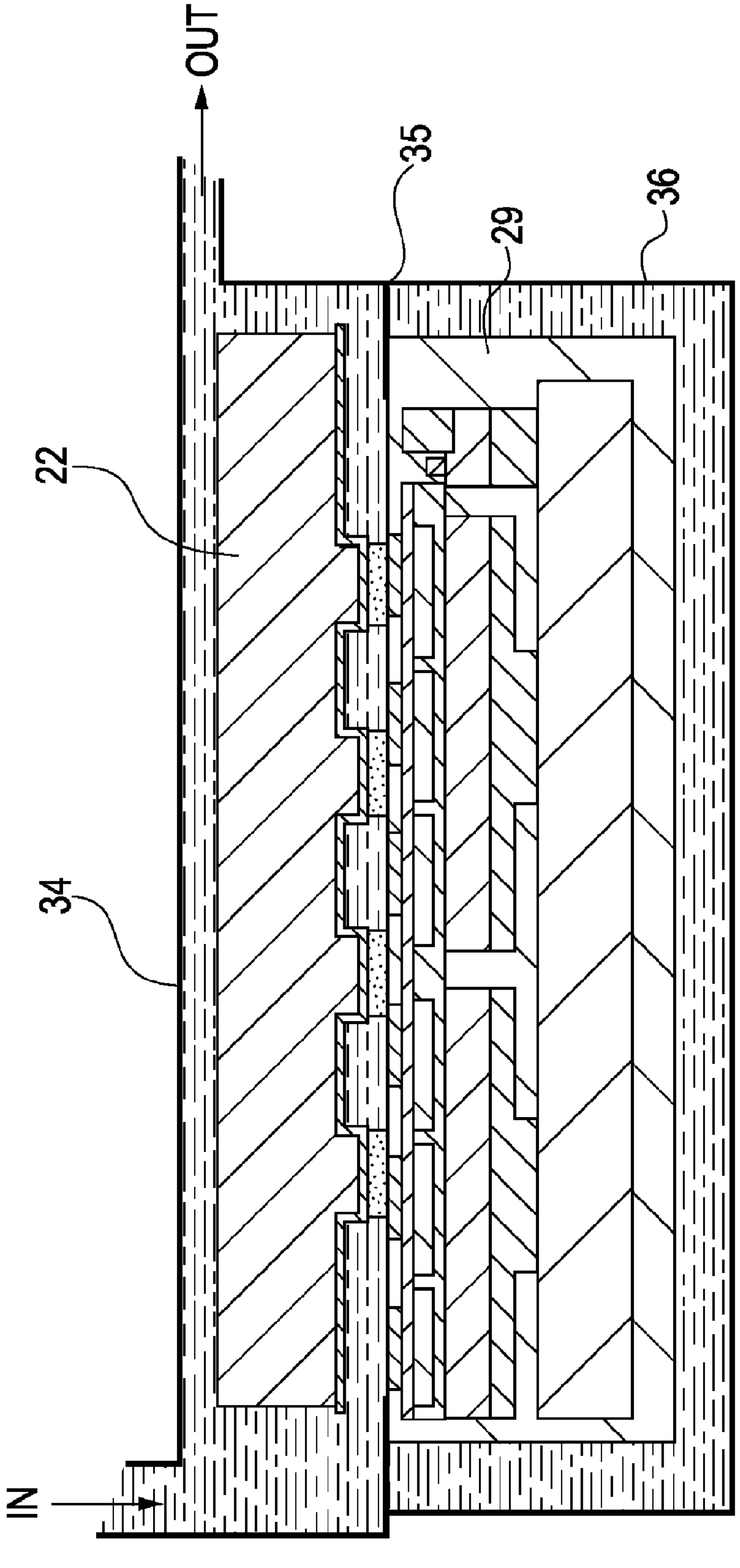
FIG. 14 is an example of a handling member removal procedure (circulation system on the handling member side).

FIG. 14 is a schematic drawing showing a procedure wherein a container 34 filled with a dissolving solution is provided to the handling member side, with the container set on top of a container 36 filled with a protective solution and the dissolving solution is supplied thereto, whereby the handling member 22 is removed by the weight of the substrate 21 itself.

It is desirable for a connecting position 35 for the container 34 to connect to the electromechanical transducer is desirable in a position so as to cover the spacing between the substrate 21 and the handling member 22 (join so as to seal the space). A portion of the integrated circuit 11 of the substrate 21 is protected with the protective case 29. This is set so that the connection position 35 of the container 34 makes contact on top of the container 36 filled with protective solution on the substrate 21 side. If the dissolving solution is filled and circulated through the container 34 in this state, the substrate 21 sinks by its own weight into the container 36 that is filled with protective solution, as the dissolving of the metallic layer 24 and adhesive layer 25 advances a certain amount. The handling member 22 can be thus removed. The protective solution is not particularly limited as long as the solution does not influence the substrate such as causing corrosion or the like. For example, the solution may be water or may be a dissolving solution. In the case that the density of the protective solution is greater than the substrate 21, the substrate can be separated without sinking. In the case of having a metallic layer 24 and adhesive layer 25 on the third face, the protective solution can be a solution that can dissolve the adhesive layer 25, thereby realizing the quick removal of the handling member 22.

In the case that the handling member 22 is fixed to the substrate 21 via multiple layers (metallic layer 24 and adhesive layer 25), first the solution that can dissolve the metallic layer 24 is supplied to the container 33 and container 34, and the handling member 22 is removed. Next, the solution that can dissolve the adhesive layer 25 is supplied to each container, whereby the membrane 4 of the substrate 21 is exposed. For a dissolving solution of the metallic layer 24, an acid or alkali solution can be used, and for a dissolving solution of the adhesive layer 25, various types of organic solvents can be used. The dissolving solution should be used according to the metallic layer 24 and adhesive layer 25. The handling member 22 removed from the substrate 21 with the above method can be removed from the substrate 21 without polishing, and accordingly can be reused.

In a first embodiment, a fabrication method for an electromechanical transducer in the case of employing a handling member provided with an adhesive layer on the channel is described. The physical parameters of the substrate and the handling member are as follows.

(Settings for Substrate)
Base material for substrate . . . p-Type {100} silicon wafer
Size of substrate . . . 4 inches (10.16 cm)
Shape/size of cavity . . . square, 20 μm each side
Shape/width of element . . . rectangular, vertical width 0.505 mm, horizontal width 6.005 mm
Number of cavities within each element . . . 4,800 (20 rows, 240 columns)
Width of membrane supporting portion (spacing between cavity and cavity) . . . 5 μm
Distance between elements . . . vertical spacing 5 μm, horizontal spacing 5 μm
Width of trench . . . 5 μm
Number of elements within one substrate . . . 1,240 (124 rows, 10 columns)

(Settings for Handling Member)
Base material for handling member . . . synthetic quartz substrate
Size of handling member . . . diameter 12 cm, thickness 1 mm
Width of channel recessed portion . . . 200 μm
Width of channel protruding portion . . . 200 μm
Channel depth . . . 200 μm
Number of channels . . . 300
Shape of channel . . . wave-form (Settings for Adhesive Layer)
Form adhesive layer on channel recessed/protruding portions
Type of adhesive layer . . . polyresist
Resist thickness . . . 20 μm (Settings for Dissolving Solution)
Acetone (1) Fabrication Procedure for Substrate (1-1) Preparation of Silicon Substrate Similar to FIG. 3A, the silicon substrate 12 is cleaned and prepared. Subsequently, a Si substrate surface is subjected to reduced resistance by diffusion or ion implantation.

(2) Fabrication of Membrane Supporting Unit

Similar to FIGS. 3B through 3D, the membrane supporting portion is fabricated, whereby the A substrate 15 is obtained.

(3) Fabrication of Cavity

Similar to FIG. 3E, an SOI wafer is prepared, and is joined to the membrane supporting portion surface fabricated in (2). Also, by activating the surface of the joining face at room temperature using an EVG 520 or the like manufactured by EV Group, joining is performed at 150° C. or less and $10^{-3}$ Pa. Next, the handling layer 18 of the joined SOI substrate is polished so that a thickness of several tens of μm remains, and is cleansed. Subsequently, a using a single-sided etching tool, the handling layer 18 is subjected to etching with a 80° C. KOH fluid while protecting the back face of the polished substrate. Subsequently, the BOX layer 17 is subjected to etching with a fluid including hydrofluoric acid, and the device layer 16 is exposed as shown in FIG. 3F. The device layer 16 herein becomes the membrane 4 of the present embodiment.

(4) Fabrication of Electrode

Similar to FIG. 3G, the device layer 16 making up the membrane 4 is subjected to patterning by dry etching near the external peripheral rim of the membrane 4. Subsequently, the oxidizing film 13 is subjected to patterning by wet etching directly without removing the photoresist for patterning. With this procedure, the etching hole 19 is formed, as shown in FIG. 3G.

Next, a Cr film for an electrode is formed by sputtering, is subjected to patterning by wet etching, and an upper electrode 5, upper electrode pad 20, and lower electrode pad 8 such as shown in FIG. 3H are formed.

Lastly, in order to electrically separate the multiple cells in the present embodiment, the device layer 16 is subjected to patterning, and a substrate is completed. Note that the protective film of the electrical wiring thereupon or the electrical wiring between the upper electrode 5 and upper electrode pad 20 are not shown in the diagram.

Figures 15A, 15B, 15C:
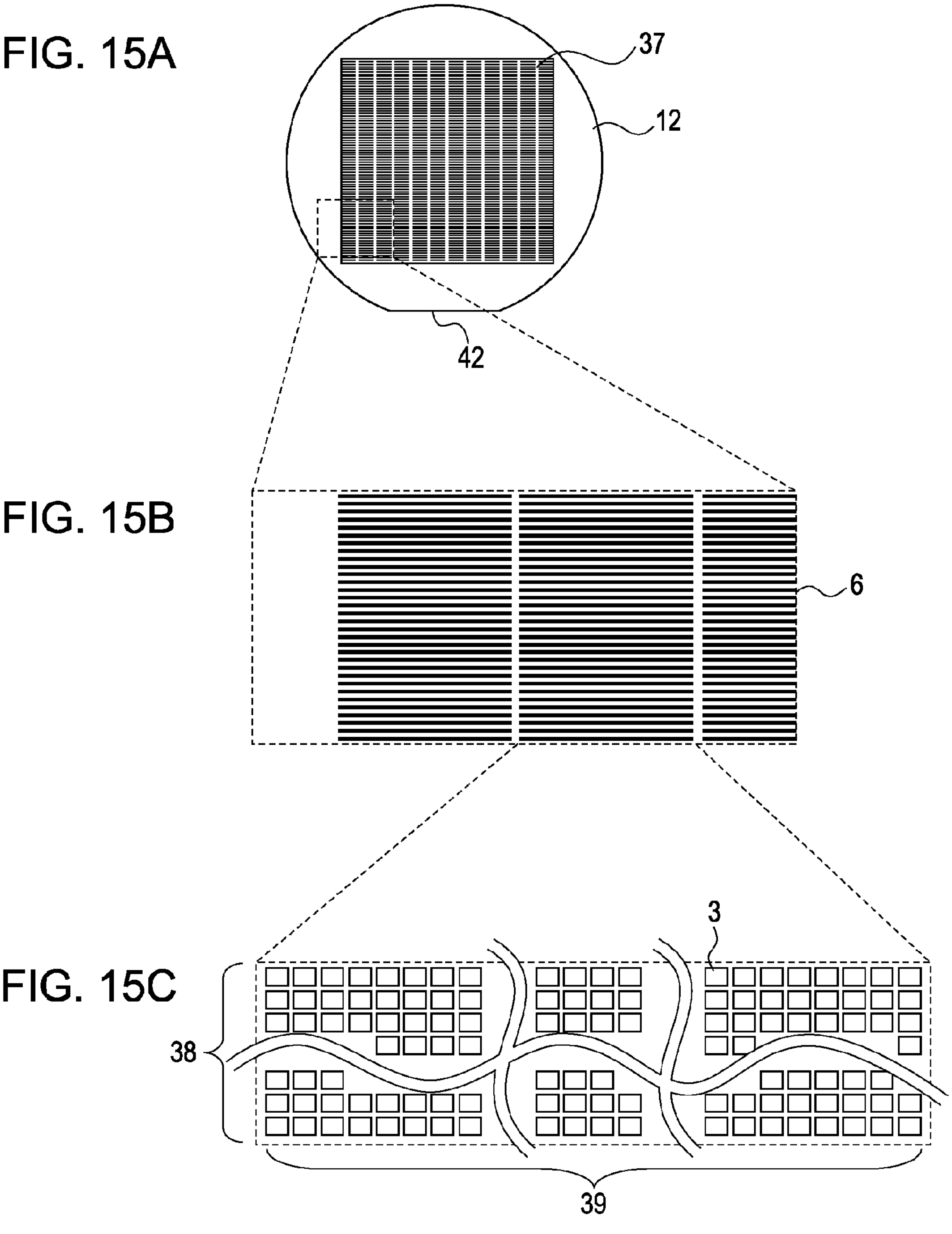
FIGS. 15A through 15C are schematic diagrams of a substrate which is fabricated according to a first embodiment.

FIGS. 15A through 15C show schematic diagrams of the substrate that is fabricated in the first embodiment. FIG. 15A is a diagram showing the element forming portion 37 on the silicon substrate 12, and FIG. 15B is an enlarged view of a portion of FIG. 15A. FIG. 15B shows that the element 6 is formed on multiple silicon substrates. FIG. 15C is an enlarged view of one element. Also in FIG. 15C, the upper electrode 5, upper electrode pad 20, lower electrode pad 8 and so forth are omitted.

Figure 16A:
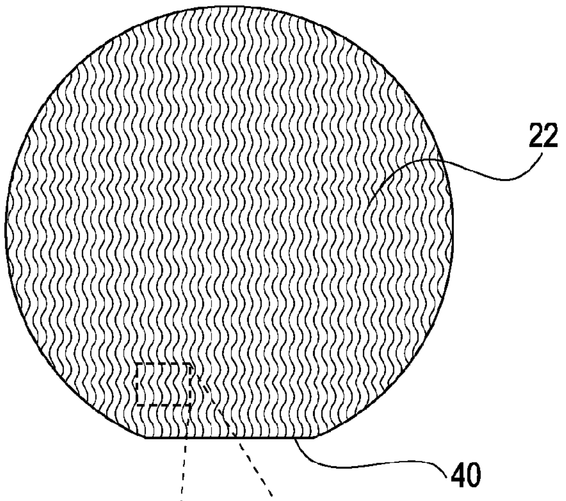
FIGS. 16A and 16B are schematic diagrams of a handling member which is fabricated according to the first embodiment.
Figure 16B:
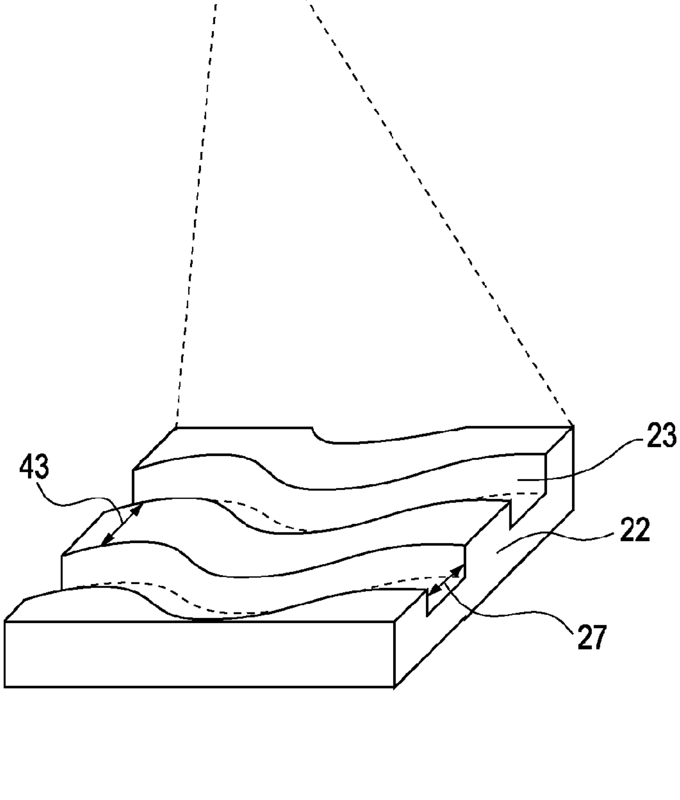

(2) Handling Member Fabrication Procedure (2-1) Fabrication of Handling Member Provided with Channel First, an already-cleaned synthetic quartz substrate is prepared. The size of the synthetic quartz substrate has a diameter of 12 cm and thickness of 1 mm. Cleaning is performed by performing ultrasound cleaning using neutral detergent and pure water, then after soaking in an alkali solution for a short period of time, again performs ultrasound cleaning using neutral detergent and pure water, and cleaning with running water. Next, a wave-shaped channel with a width of 200 μm and depth 200 μm is fabricated with a $CO_2$ laser process on one face of the cleaned synthetic quartz substrate, so that the channel spacing becomes 200 μm. With the laser process, a channel wall that is nearly perpendicular is formed by shifting the laser focus point from the surface of the third face towards the fourth face a little at a time. Also, by performing laser processing in a vacuum, quartz that is melted during the process is prevented from attaching to the channel surface. Cleansing the handling member that has been processed again yields the handling member with 300 wave-form channels formed therein. FIG. 16A is an external view schematic diagram of the handling member fabricated with the first embodiment. FIG. 16B is a schematic diagram wherein a portion of FIG. 16A is enlarged.

(2-2) Formation of Adhesive Layer

A polyresist is sprayed on so as to coat the channel recessed/protruding portions of the handling member providing the channels fabricated in (2-1), whereby an adhesive layer with a thickness of 20 μm is formed.

(3) Fixing Procedure (3-1) Positioning of Handling Member

Figure 17A:
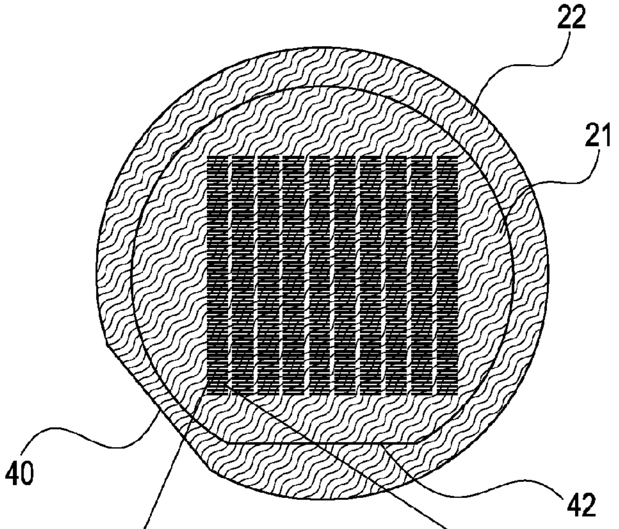
FIGS. 17A through 17C are projection views of a bonding direction of the substrate and handling member according to the first embodiment.
Figure 17B:
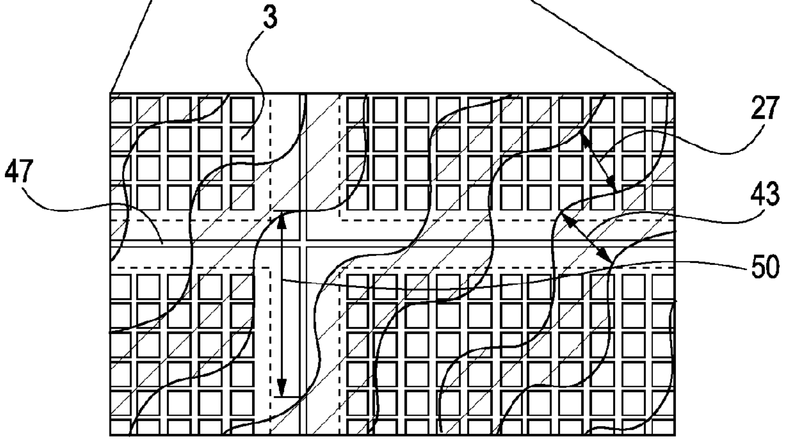
Figure 17C:
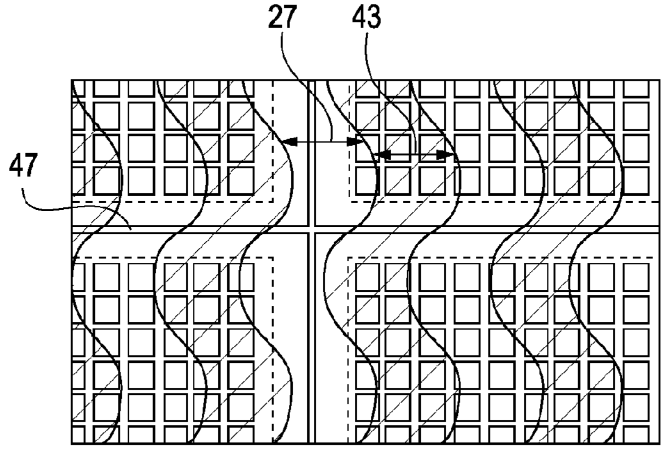

The third face of the handling member fabricated in (2) is made to face the first face of the substrate that is fabricated in (1). At this time, the handling member is rotated by 45 degrees and positioned as to the substrate. FIG. 17A shows a projected view in the event of fixing the handling member to the substrate in the first embodiment. FIG. 17B shows an enlarged view of a portion of FIG. 17A. FIG. 17C shows an enlarged view of the case in which the handling member is positioned without rotating as to the substrate (in the case that an orientation flat 42 of the substrate and an orientation flat 40 of the handling member match in FIG. 17A). In both FIGS. 17B and 17C, at least a portion within the elements is supported by the handling member. Accordingly, in either case the burden placed on the elements can be reduced. Also, as in FIG. 17B, upon positioning with an angle provided, the length 50 of the trench formed portion corresponding to the channel recessed portion is shorter than the length of the longest side 39 of the element, whereby the channel protruding portion of the handling member can be positioned so as to straddle the trench. Accordingly, the burden placed on the thin trenched portion can be reduced. Also in this case, for each element, the edge of the groove intersects with sides of at least two or more element, whereby each element will always have a portion that is supported by the channel protruding portion.

(3-2) Fixing of Substrate and Handling Member

While in the state that the substrate and the handling member are positioned, this is baked in an oven heated to roughly 115° C. for approximately 30 minutes, thereby fixing the handling member 22 to the substrate 21.

(4) Preparation of Integrated Circuit (401) Forming Flip Chip Pad Onto Integrated Circuit The integrated circuit 11 is prepared, and a 5 μm Ni/Al layer is formed with a solder bump serving as a flip chip pad. Next, a Sn/Pb eutectic solder ball with a diameter of 80 μm is formed on the flip chip pad.

(5) Back Face Processing Procedure of Substrate (5-1) Back-Grinding Procedure

The silicon substrate of the second face of the substrate to which the handling member 22 is fixed in (3) is subjected to polishing until a thickness of roughly 150 μm remains.

(5-2) Trench Forming

Dry etching is performed down to the layer of the heat-oxidized film on the cavity side, and a trench is fabricated so as to separate each element. The width of the fabricated trench is 5 μm.

(5-3) Formation of Lower Electrode Layer to Serve as Lower Electrode

The lower electrode layer 9 for taking out a signal is provided on the protruding portion of the second face, whereby films are formed such that Ti is 200 A, Cu is 500 A, and Au is 2000 A.

(5-4) Flip Chip Bonding

The position of the eutectic solder ball of the integrated circuit prepared in (4) and the position of the signal electrode layer are aligned, following which both are bonded together with a force of roughly 4 g/bump at 150° C.

(6) Handling Member Removal Procedure (6-1) Protection of Integrated Circuit Side The portions other than the handling member of the substrate whereupon the integrated circuit is joined in (5) are covered with a protective case. The protective case is positioned so as to not make contact with the elements.

(6-2) Immersion in Dissolving Solution

A container 33 filled with acetone solution is prepared, such as shown in FIG. 13, and the substrate which is covered with the protective case in (6-1) is set on the container 33. The container 33 is connected to a circulating pump, and the acetone solution within is circulated by the pump. After a certain amount of time has passed, the amount of circulating acetone solution is reduced, and the state of dissolving of the adhesive layer is confirmed. Upon confirming several times, the substrate that is covered with the protective layer moves along with the reduction of the surface of the acetone solution within the container 33, and is separated from the handling member.

(7) Completion of Electromechanical Transducing Apparatus (7-1) Cleaning and Removal of Protective Case The substrate is cleaned while still covered with the protective case, and upon the protective case being removed, the electromechanical transducing apparatus is completed.

With a manufacturing method such as described above, the burden placed on the elements can be reduced. Also, with the positioning such as shown in FIG. 17A, the length of the trench formed portion not supported by the channel protruding portion becomes shorter than the length of the longest side of the element, whereby mechanical strength of the trench formed portion improves, and the probability that the substrate will break is further reduced.

A second embodiment describes a manufacturing method of an electromechanical transducing apparatus that employs a handling member provided with a channel (wave-shaped channel+hole) and a metallic layer (Ge). The physical parameters of the substrate and the handling member are as follows.

(Settings for Substrate)

Base material for substrate . . . p-Type {100} silicon wafer

Size of substrate . . . 4 inches (10.16 cm)

Shape/size of cavity . . . hexagon of 125 μm each side

Shape/width of element . . . multi-angle, vertical width roughly 6 mm, horizontal width roughly 6 mm (see FIGS. 18A through 18D)

Number of cavities within each element . . . 780 (see FIGS. 18A through 18D)

Width of membrane supporting portion (spacing between cavity and cavity) . . . 5 μm Distance between elements . . . vertical spacing 5 μm, horizontal spacing 5 μm Number of elements within one substrate . . . 100 (10 rows, 10 columns)

(Settings for Handling Member)

Base material for handling member . . . synthetic quartz substrate

Size of handling member . . . diameter 12 cm, thickness 2 mm

Figure 18A:
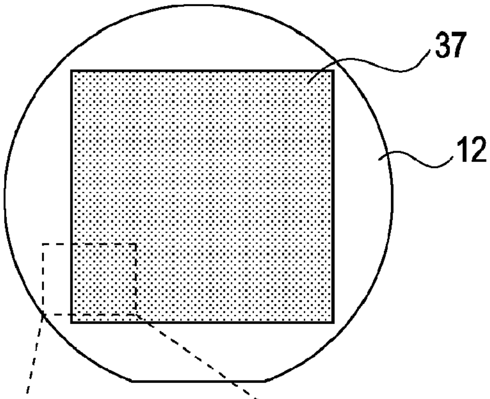
FIGS. 18A through 18D are schematic diagrams of a substrate which is fabricated according to a second embodiment.
Figure 18B:
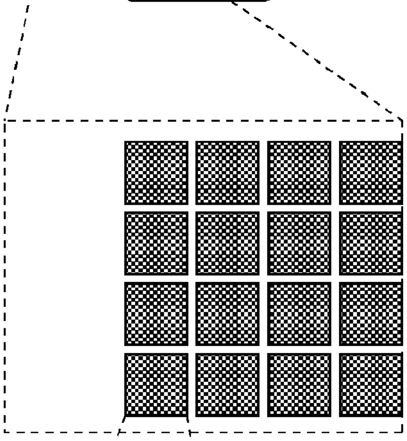
Figure 18C:
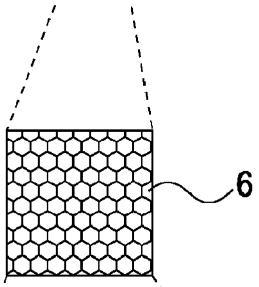
Figure 18D:
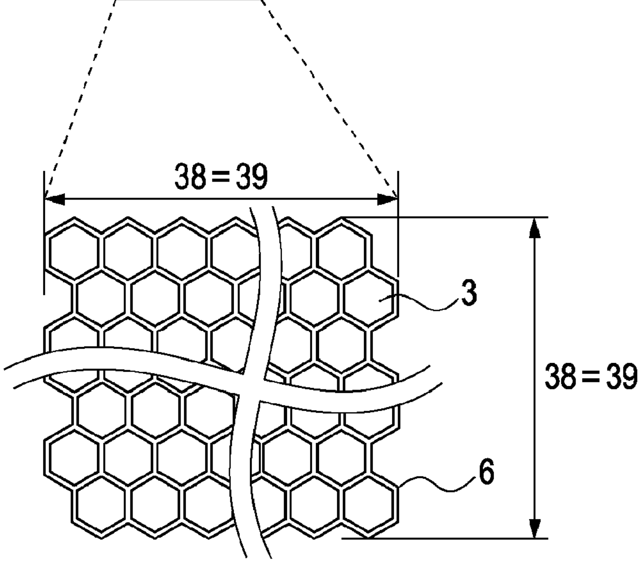

Width of channel recessed portion . . . 1 mm
Width of channel protruding portion . . . 0.5 mm
Channel depth . . . 0.4 mm
Channel pitch . . . 1.5 mm
Number of channels . . . 80
Size of channel hole . . . diameter 1 mm
Pitch of channel holes . . . 5 mm (along each channel from each channel edge)
(Settings for Adhesive Layer)
Form adhesive layer on first face
Type of adhesive layer . . . polyresist
Thickness of adhesive layer . . . 20 μm
(Settings for Metallic Layer)
Form on entire channel recessed/protruding portions
Type of metallic layer . . . Ge
Thickness of metallic layer . . . 2 μm
(Settings for Dissolving Solution)
Dissolving solution for metallic layer . . . $H_2O_2$
Dissolving solution for adhesive layer . . . acetone (1) Fabrication of Substrate The substrate is prepared, similar to (1-1) through (1-4) of the first embodiment. Note that FIGS. 18A through 18D are schematic diagrams of the substrate that can be fabricated with the second embodiment. FIG. 17A shows the edge direction 46 of the first membrane supporting portion of the substrate 21. FIG. 18B is a diagram showing a portion of FIG. 18A enlarged, and shows that multiple elements 6 are formed on the silicon substrates. FIG. 18C is a schematic diagram of one element shape, and FIG. 18D shows a specific state of a cell. The number of cells are omitted in FIG. 18D, but in reality 780 cells are fabricated in staggered form. The size of one element at this time has an element vertical width of 6 mm and element horizontal width of 6 mm, whereby the longest side 39 of the element and the shortest side 38 of the element are the same length. Also, FIG. 18D omits the upper electrode 5, upper electrode pad 20, lower electrode pad 8, and so forth. Also, confirmation can be made by observing the fabricated first face with a laser yield measuring tool that, similar to the first embodiment, the first face is bent towards the second face side by atmospheric pressure.

Figures 19A, 19B:
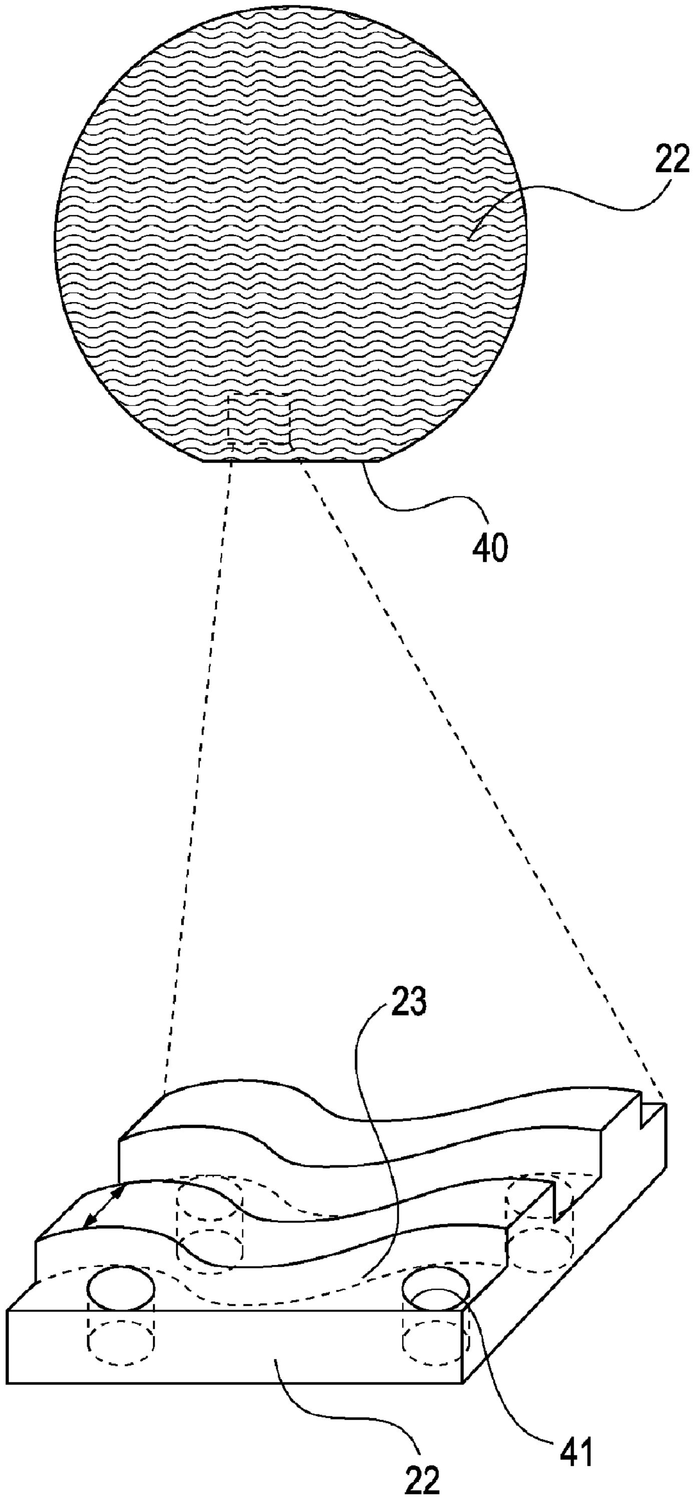
FIGS. 19A and 19B are schematic diagrams of a handling member which is fabricated according to the second embodiment.

(2) Fabrication of Handling Member Providing Metallic Layer on Channel, and Formation of Adhesive Layer on First Face (2-1) Handling Member Fabrication Procedure First, an already-cleaned synthetic quartz substrate is prepared with a diameter of 12 cm and thickness of 2 mm. Cleaning is performed by performing ultrasound cleaning using neutral detergent and pure water, then after soaking in an alkali solution for a short period of time, ultrasound cleaning is performed again using pure water and ultrapure water, and cleaning with running water. Next, a wave-shaped channel with a width of 1 mm and depth 0.4 mm is fabricated with $CO_2$ laser process on one face of the cleaned synthetic quartz substrate, so that the channel spacing becomes 1.5 mm. Following the processing of the wave-shaped channel, a through hole is formed by a $CO_2$ laser in the channel recessed portion. Through holes with a diameter of 1 mm are formed at 5 mm spacing from the channel recessed portion. With the laser process, a channel wall that is nearly perpendicular is formed by shifting the laser focus point from the surface of the third face towards the fourth face a little at a time. Also, by performing laser processing in a vacuum, quartz that is melted during the process is prevented from attaching to the channel surface. Next, the handling member that has been processed again is cleaned, and a handling member is obtained whereupon 80 rectilinear channels having through holes are provided. FIG. 19A is an external view schematic diagram of the handling member fabricated with the second embodiment. FIG. 19B is a schematic diagram wherein a portion of FIG. 19A is enlarged.

(2-2) Formation of Metallic Layer

A Ge film with thickness of 2 μm is formed by sputtering onto the channel recessed/protruding portions of the handling member and the through hole wall faces fabricated in (2-1).

(2-3) Formation of Adhesive Layer

A polyresist is sprayed on to coat the membrane side of the substrate 21 that is fabricated in (1), and an adhesive layer 25 with a thickness of 20 μm is formed.

Figure 20:
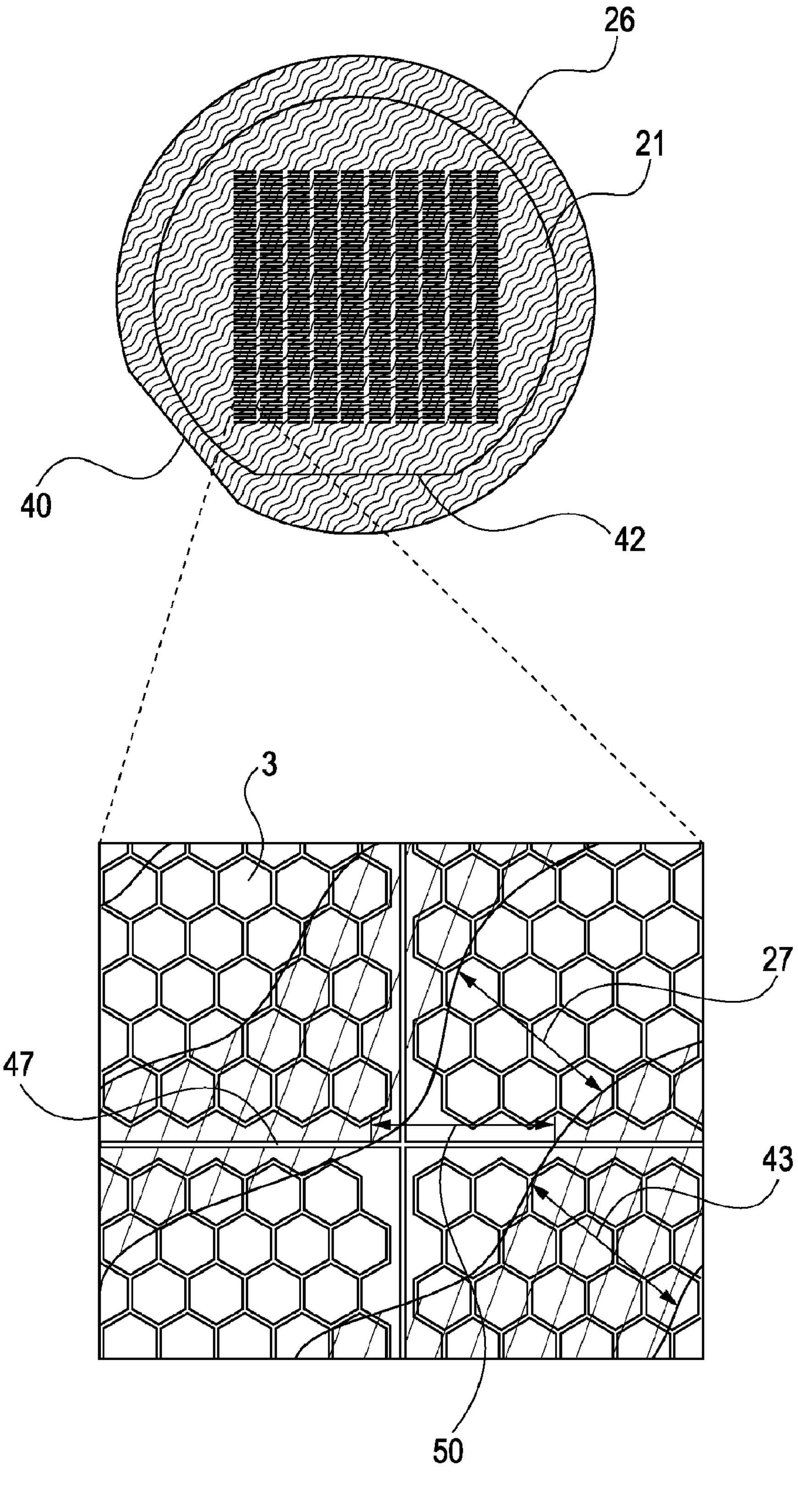
FIG. 20 is a projection view of a bonding direction of the substrate and handling member according to the second embodiment.

(3) Fixing Procedure of Handling Member (3-1) Positioning of Substrate and Handling Member The third face of the handling member fabricated in (2) is made to face the first face of the substrate that is fabricated in (1). Similar to the first embodiment, the handling member is positioned with an angle provided between the orientation flat of the substrate and the orientation flat of the handling member (see FIG. 20). By taking such a position, not only is at least a portion within the elements supported by the handling member, but the length of the trench formed portion corresponding to the channel recessed portion becomes smaller than the length of the longest side of the element. That is to say, the length of the trench formed portion not supported by the handling member is shorter than the length of the longest side of the element, and the channel protruding portion of the handling member is positioned so as to straddle the trench. Also in this case, for each element, the edge of the groove intersects with at least two or more element sides, whereby each element will always have a portion that is supported by the channel protruding portion.

(3-2) Fixing of Handling Member

While in the state that the substrate and the handling member are in contact, this is baked in an oven heated to roughly 115° C. for approximately 30 minutes, thereby fixing the handling member to the substrate.

(4) Preparation of Integrated Circuit

The integrated circuit is prepared, similar to (4) in the first embodiment.

(5) Back Face Processing Procedure of Substrate

The back face process of the substrate is performed, similar to (5) in the first embodiment.

(6) Handling Member Removal Process (6-1) Protection of Integrated Circuit Side

Similar to (6) in the first embodiment, the portions other than the handling member of the substrate whereupon the integrated circuit is joined are covered with a protective case.

(6-2) Immersion of Metallic Layer in Dissolving Solution

A container 33 such as shown in FIG. 13 is prepared, and the substrate which is covered with the protective case in (6-1) is set on the container 33. The container 33 is connected to a circulating pump, hydrogen peroxide solution is supplied therein, and is circulated by the pump. After a certain amount of time has passed, the amount of circulating hydrogen peroxide solution is reduced, and the state of dissolving of the metallic layer is confirmed. Upon confirming several times, the substrate that is covered with the protective layer moves toward the bottom side of the container 33 along with the reduction of the surface of the hydrogen peroxide solution within the container 33, and is separated from the handling member.

(6-3) Immersion of Adhesive Layer in Dissolving Solution

Following removal of the handling member, the handling member is taken out of the container 33, and a lid is placed on the container 33. The hydrogen peroxide solution within the container 33 is removed, and an acetone solution is supplied thereto. Next, the acetone solution is circulated by the pump, and dissolves the resist that is adhered to the first face.

(7) Completion of Electromechanical Transducer (7-1) Cleaning and Removal of Protective Case The substrate is cleaned while still covered with the protective case 29, and upon the protective case being removed, the electromechanical transducer is completed.

By fabricating as described above, the probability that a substrate will break can be reduced. Also, by providing a metallic layer on the channel, removal of the handling member can be readily performed.

In a third embodiment, a fabrication method is described for an electromechanical transducing apparatus employing a handling member such that the channel protruding portion makes contact with the elements and entire trench formed portion. The physical parameters of the substrate and the handling member are as follows.

(Settings for Substrate)

Settings are the same as with the second embodiment.

(Settings for Handling Member)

Base material for handling member . . . synthetic quartz substrate

Size of handling member . . . diameter 12 cm, thickness 2 mm

Width of channel recessed portion . . . 1 mm

Figure 21A:
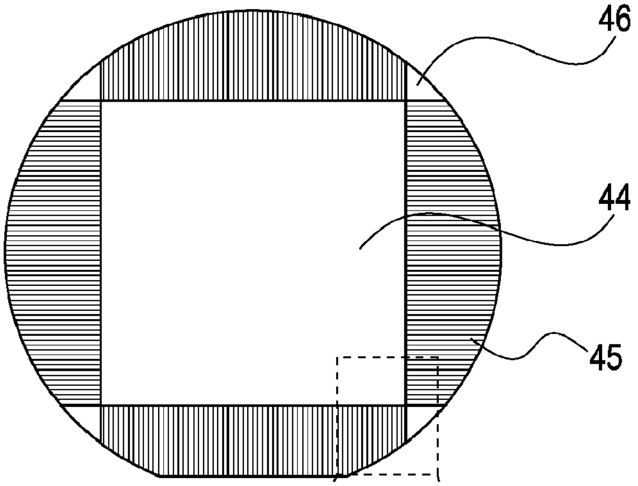
FIGS. 21A and 21B are schematic diagrams of a handling member which is fabricated according to a third embodiment.
Figure 21B:
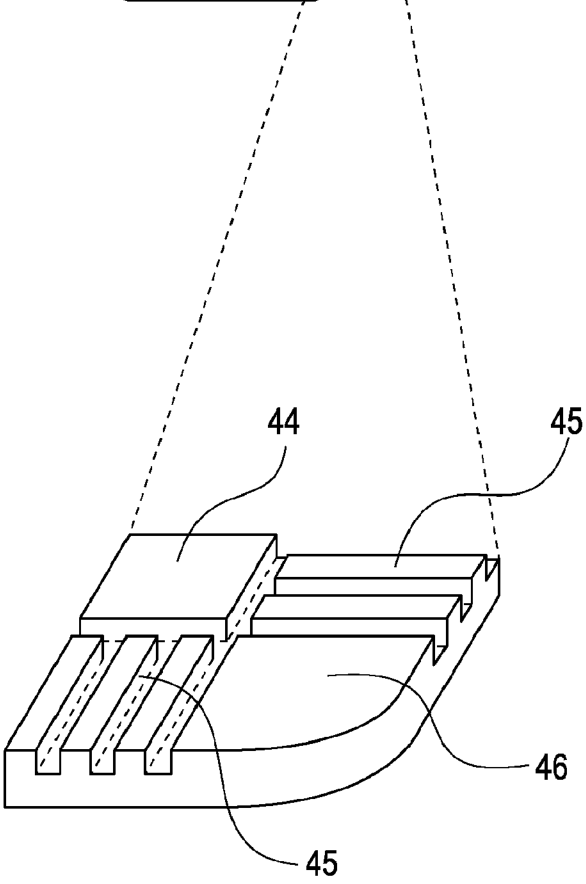

Width of first channel protruding portion . . . vertical width 6.1 mm, horizontal width 6.1 mm Width of second channel protruding portion . . . 1 mm Channel depth . . . 0.4 mm Shape of Channel . . . rectilinear (see FIGS. 21A and 21B)

(Settings for Adhesive Layer)

Settings are the same as in the second embodiment.

(Settings for Metallic Layer)

Settings are the same as in the second embodiment.

(Settings for Dissolving Solution)

Settings are the same as in the second embodiment.

(1) Fabrication Procedure for Substrate

Settings are the same as in (1) of the second embodiment.

(2) Fabrication of Handling Member Provided with Metallic Layer on Channel and Formation of Adhesive Layer on First Face (2-1) Handling Member Fabrication Procedure First, an already-cleaned synthetic quartz substrate is prepared with a diameter of 12 cm and thickness of 2 mm. Cleaning is performed by performing ultrasound cleaning using neutral detergent and pure water, then after soaking in an alkali solution for a short period of time, ultrasound cleaning is performed again using pure water and ultrapure water, and cleaning with running water. Next, a first channel protruding portion is fabricated on one face of the cleaned synthetic quartz substrate (see FIGS. 21A and 21B). A first channel protruding portion 44 has a channel recessed portion with four rectilinear channels fabricated with a $CO_2$ laser procedure, so that a channel protruding portion that is 6.1 mm square is formed in the center thereof. The width of the channel recessed portion is 1 mm and the depth thereof is 0.4 mm. Further, multiple second channel protruding portions 45 are provided by fabricating a channel recessed portion with the CO2 laser procedure on the periphery of the first channel protruding portion so as to overlap the four channel recessed portions forming the first channel protruding portion. The width of the channel recessed portion and channel protruding portion are 1 mm and the depth thereof is 0.4 mm. Thus, multiple second channel protruding portions are provided. Note that channel recessed portions are not provided to the four corners of the channel protruding portion 46. With the laser procedure, a channel wall that is nearly perpendicular is formed by shifting the laser focus point from the third face towards the fourth face a little at a time. Also, by performing the laser procedure in a vacuum, quartz that is melted during the procedure is prevented from attaching to the channel surface. The handling member that has been processed again is cleaned, whereby a handling member is obtained such as shown in FIGS. 21A and 21B. FIG. 21A is an external view schematic diagram, and FIG. 21B is a schematic diagram wherein a portion of FIG. 21A is enlarged.

(2-2) Formation of Metallic Layer

Preparation is made the same as in (2-2) of the second embodiment.

(2-3) Formation of Adhesive Layer

Preparation is made the same as in (2-3) of the second embodiment.

(3) Fixing Procedure of Handling Member (3-1) Positioning of Substrate and Handling Member The third face of the handling member fabricated in (2) is made to face the first face of the substrate that is fabricated in (1). At this time, the handling member is positioned so that the element and the trench formed portion are all supported by the handling member (so as to be covered with the channel protruding portion).

(3-2) Fixing of Handling Member

While in the state that the substrate and the handling member are together, this is baked in an oven heated to roughly 115° C. for approximately 30 minutes, thereby fixing the handling member to the substrate.

(4) Preparation of Integrated Circuit

The integrated circuit is prepared, similar to (4) in the second embodiment.

(5) Back Face Processing Procedure of Substrate

The back face process of the substrate is performed, similar to (5) in the second embodiment.

(6) Handling Member Removal Process

The removal of the handling member is performed, similar to (6) in the second embodiment.

(7) Completion of Electromechanical Transducer

The electromechanical transducer is completed, similar to (7) in the second embodiment.

By fabricating as described above, the elements and the trench processing portions are all supported by the handling member, whereby the probability that the substrate will break can be reduced. Also, by providing a metallic layer on the channel, removal of the handling member can be readily performed.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-165066 filed Jun. 24, 2008, which is hereby incorporated by reference herein in its entirety.

What is claimed is:

1. A manufacturing method of an electromechanical transducer, said electromechanical transducer having an element comprising:

a substrate; and a vibrating membrane provided so that a space is formed between the substrate and the vibrating membrane;

said manufacturing method including fixing a handling member, wherein a groove is formed, to a face on a vibrating membrane side of the element;

forming a trench on a face on an opposite side from the face of the side wherein the vibrating membrane is formed on the element; and removing the handling member from the element, wherein in the fixing of the handling member, the groove of the handling member configures a portion of a channel to externally communicate in a state of the handling member being fixed to the element, and wherein the handling member is fixed to the substrate so that at least a portion within the element is supported by the handling member.

2. The manufacturing method of an electromechanical transducer according to claim 1, wherein the handling member is fixed to the substrate so that a length of a portion of the trench formed portion not supported by the handling member is shorter than a length of a longest side of the element.

3. The manufacturing method of an electromechanical transducer according to claim 1, wherein in the fixing of the handling member, the handling member is fixed to the substrate so that a length of a portion of the trench formed portion not supported by the handling member is shorter than a length of a shortest side of the element.

4. The manufacturing method of an electromechanical transducer according to claim 1, wherein in the fixing of the handling member, the handling member is fixed to the substrate so that an entire portion of the trench formed portion is supported by the handling member.

5. The manufacturing method of an electromechanical transducer according to claim 1, wherein the electromechanical transducer comprises a plurality of elements, and in the fixing of the handling member, the handling member is fixed to the substrate so that for each element, the edge of the groove intersects sides of at least two or more elements.

6. The manufacturing method of an electromechanical transducer according to claim 1, wherein said electromechanical transducer comprises a plurality of elements, and all of the elements are supported by the handling member.

7. The manufacturing method of an electromechanical transducer according to claim 1, wherein in the fixing of the handling member, the handling member is fixed to the substrate via only an adhesive layer or an adhesive layer and metallic layer, wherein, in the removing of the handling member, a dissolving solution is supplied to the channel to dissolve the adhesive layer in the event that the handling member is fixed via the adhesive layer alone, and an acid or alkali dissolving solution is supplied to the channel to dissolve the metallic layer in the event that the handling member is fixed via the adhesive layer and metallic layer, so that the handling member is removed from the substrate.

* * * * *